(12) United States Patent
Rub

(10) Patent No.: US 8,327,226 B2
(45) Date of Patent: Dec. 4, 2012

(54) ADJUSTABLE ERROR CORRECTION CODE LENGTH IN AN ELECTRICAL STORAGE DEVICE

(75) Inventor: Bernardo Rub, Sudbury, MA (US)

(73) Assignee: Seagate Technology LLC, Cupertino, CA (US)

( * ) Notice: Subject to any disclaimer, the term of this patent is extended or adjusted under 35 U.S.C. 154(b) by 502 days.

(21) Appl. No.: 12/699,505

(22) Filed: Feb. 3, 2010

(65) Prior Publication Data

US 2011/0191654 A1    Aug. 4, 2011

(51) Int. Cl.
*G11C 29/00* (2006.01)
(52) U.S. Cl. ........................................ 714/763
(58) Field of Classification Search .................. 714/746, 714/763, 769–770, 773
See application file for complete search history.

(56) References Cited

U.S. PATENT DOCUMENTS

| | | | |
|---|---|---|---|
| 4,531,203 A | 7/1985 | Masuoka et al. | |
| 5,668,976 A | 9/1997 | Zook | |
| 5,754,567 A | 5/1998 | Norman | |
| 7,224,604 B2 | 5/2007 | Lasser | |
| 7,444,579 B2 | 10/2008 | Radke et al. | |
| 7,587,658 B1 | 9/2009 | Tong et al. | |
| 7,616,499 B2 | 11/2009 | Wan et al. | |
| 7,739,576 B2 * | 6/2010 | Radke | 714/758 |
| 8,214,580 B2 * | 7/2012 | Lucas et al. | 711/103 |
| 2005/0055495 A1 | 3/2005 | Vihmalo et al. | |
| 2008/0307270 A1 | 12/2008 | Li | |
| 2009/0125790 A1 | 5/2009 | Iyer et al. | |

* cited by examiner

*Primary Examiner* — Shelly A Chase
(74) *Attorney, Agent, or Firm* — Cesari & Reed, LLP; Kirk A. Cesari

(57) ABSTRACT

An apparatus includes a memory that is allocated to reported portions and overprovisioned portions. The apparatus includes an error correction circuit that communicates with the memory in error correction coded data that has a controllable ECC length. The ECC length is a function of a history of error reports. A memory allocation engine balances a size of the overprovisioned portions to maintain a size of the reported portions. The balancing is performed as a function of an average of ECC lengths in the ECC length table over a time interval in which a size of the memory decreases with accumulated erase cycles of the memory.

19 Claims, 21 Drawing Sheets

US 8,327,226 B2

ADJUSTABLE ERROR CORRECTION CODE LENGTH IN AN ELECTRICAL STORAGE DEVICE

BACKGROUND OF THE INVENTION

The present disclosure relates generally to electrical storage drives, and more particularly to electrical storage drives in which memory is subject to wear from program/erase cycles. As electrical memory wears, a rate of readback errors increases. Error correction coding is known, however error correction coding usually has a long length in order to provide adequate error correction throughout a life of the memory. Use of a long length error correction code undesirably decreases an overprovisioned memory size and increases wear.

Aspects of the present invention provide solutions to these and other problems, and offer other advantages over the prior art.

SUMMARY OF THE INVENTION

Disclosed is an apparatus. The apparatus comprises a memory. The memory is allocated to reported portions, and overprovisioned portions.

The apparatus comprises an error correction circuit. The error correction circuit generates error reports. The error correction circuit communicates with the memory in error correction coded data. The error correction coded data has a controllable length referred to as the ECC length. The controllable ECC length is controlled by an ECC length input.

The apparatus comprises an ECC length update circuit. The ECC length update circuit receives the error reports. The ECC length update circuit provides an ECC length update to an ECC length table as a function of a history of error reports.

The apparatus comprises an ECC length controller. The ECC length controller accesses the ECC length table and provides an ECC length to the ECC length input.

The apparatus comprises a memory allocation engine. The memory allocation engine accesses the ECC length table. The memory allocation engine balances a size of the overprovisioned portions to maintain a size of the reported portions. The balancing is performed as a function of an average of ECC lengths in the ECC length table over a time interval in which a size of the memory decreases with accumulated erase cycles of the memory.

Other features and benefits that characterize embodiments of the present invention will be apparent upon reading the following detailed description and review of the associated drawings.

DETAILED DESCRIPTION OF ILLUSTRATIVE EMBODIMENTS

Figure 1:
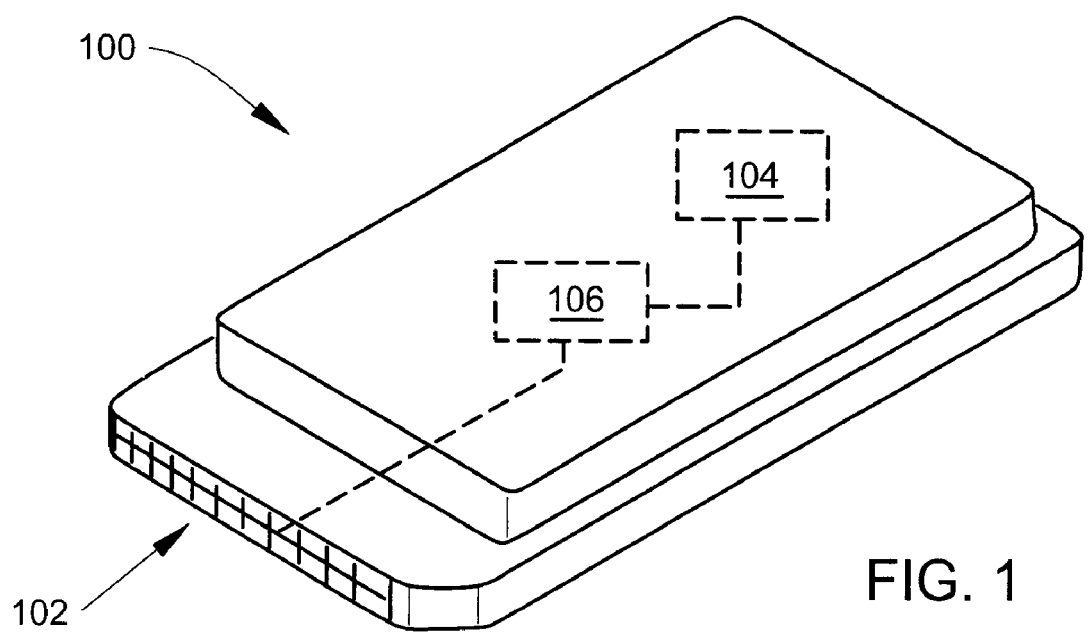
FIG. 1 illustrates an exemplary apparatus for storing data.

FIG. 1 illustrates an exemplary apparatus 100 for non-volatile storage of data. The apparatus 100 comprises an electrical connector 102 that is useful for electrical connection of the apparatus 100 to a host computer (not illustrated). The apparatus 100 comprises a non-volatile memory 104 and provides non-volatile storage of data for the host computer. The non-volatile memory 104 is coupled to a host computer through an electrical interface circuit 106 that couples to both the non-volatile memory 104 and the electrical connector 102. According to one aspect, the non-volatile memory 104 can be electrically erased in limited address ranges, such as pages or blocks, and reprogrammed after erasure. According to another aspect, no power is needed to maintain storage of data in the memory 104. According to another aspect, data is stored electrically rather than magnetically. According to another aspect, data is stored as a trapped electrical charge or as an electrically polarized ferroelectric element or domain.

According to one aspect, the apparatus 100 comprises a flash memory apparatus. According to another aspect, the apparatus 100 comprises a NAND flash memory apparatus. According to another aspect, the apparatus 100 comprises a NOR flash memory apparatus. According to another aspect, the apparatus 100 comprises an EEPROM memory apparatus. According to another aspect the apparatus 100 comprise a ferroelectric memory apparatus.

According to one aspect, the apparatus 100 comprises mechanical and electrical interfaces that are compatible with installation in a standard PCMCIA slot in a host computer. The mechanical and electrical interfaces shown in FIG. 1 are only exemplary, and the apparatus can also be arranged to plug into a standard internal bus of a desktop computer, or arranged to interface with a host computer via a Firewire bus, a USB bus or a SATA bus. According to one aspect, the apparatus 100 comprises a block diagram such as that described below in connection with an example illustrated in FIGS. 2-3.

Figure 2:
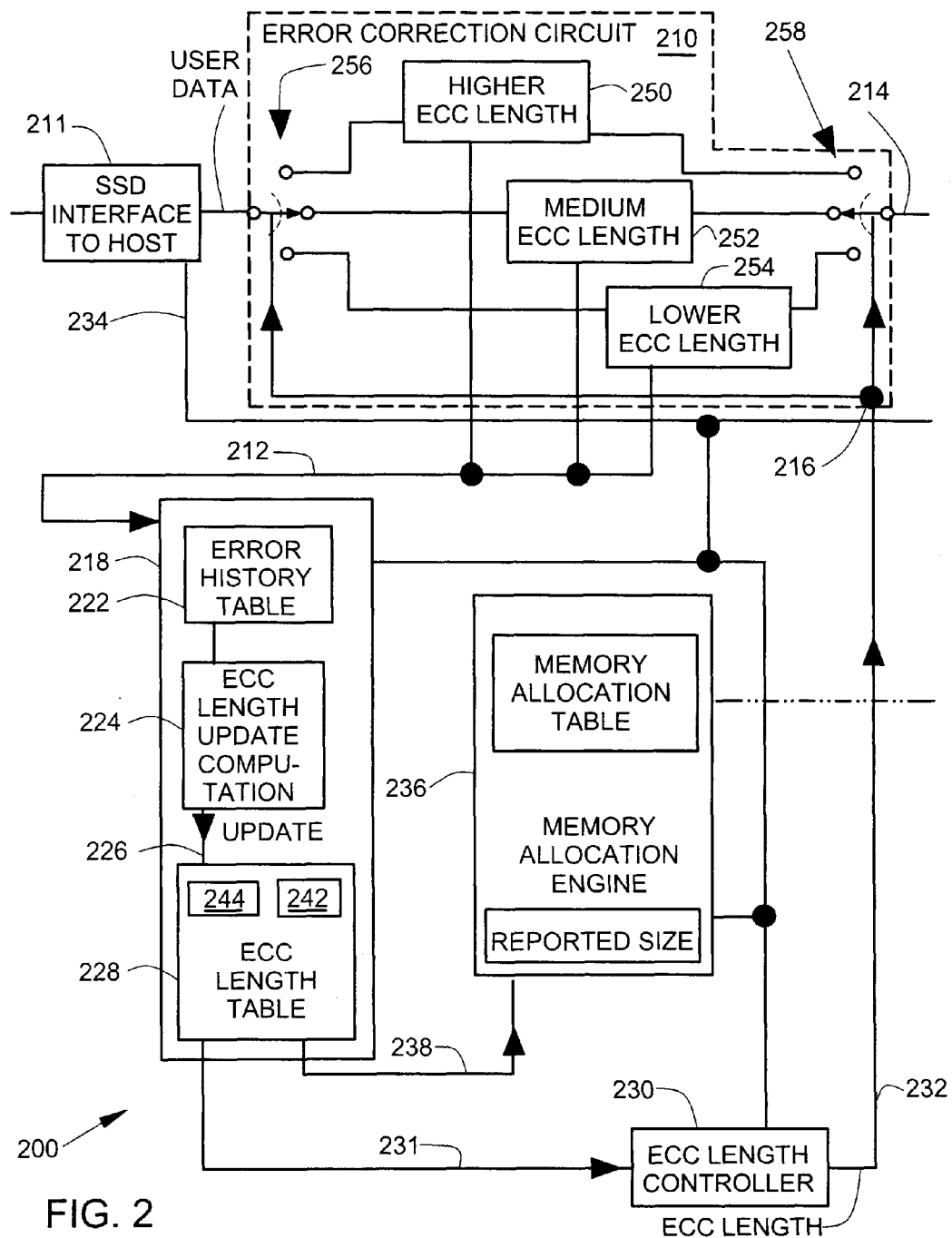
FIGS. 2-3, taken together, illustrate a block diagram of an exemplary apparatus for storing data.
Figure 3:
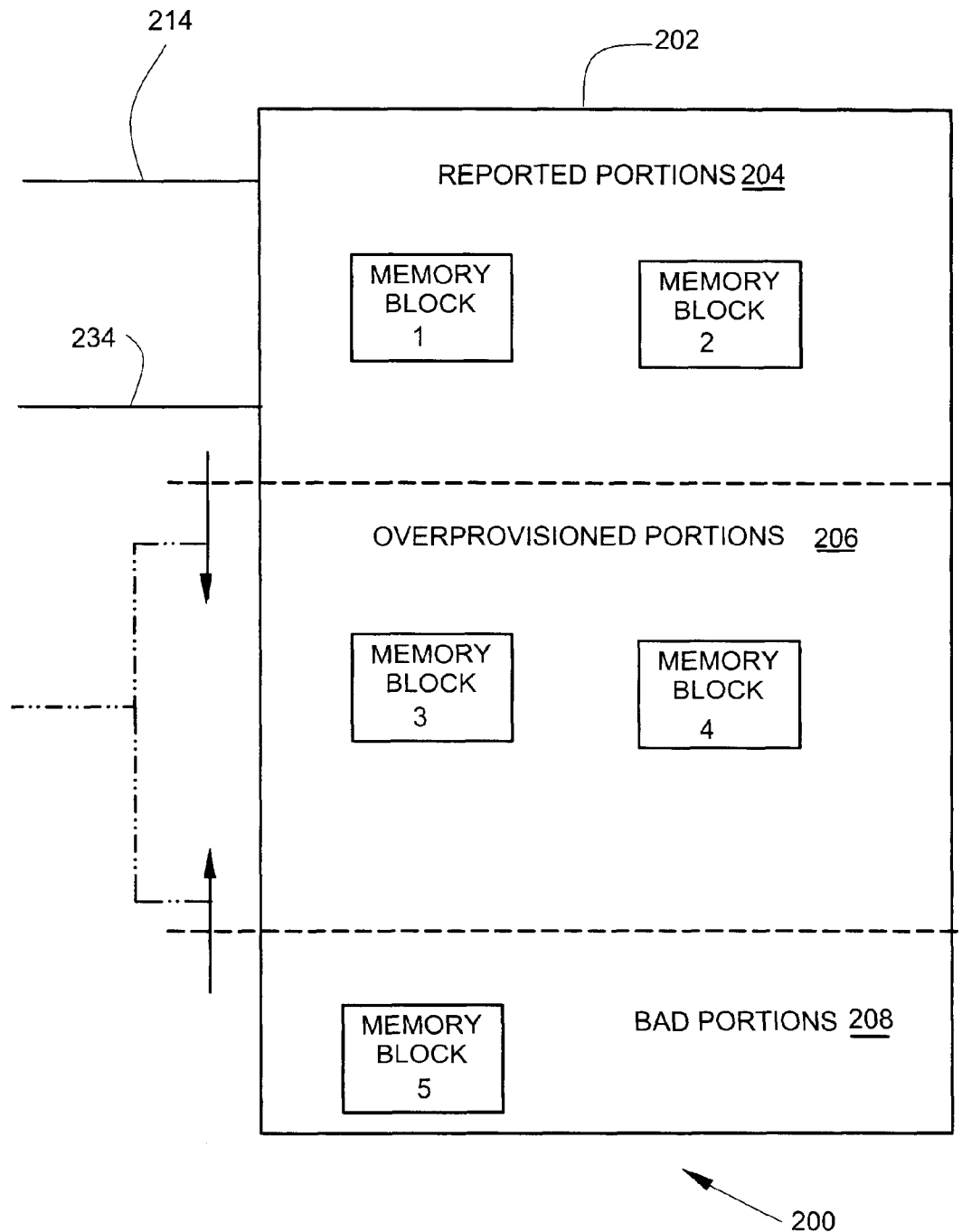

FIGS. 2-3, taken together, illustrate a block diagram of an exemplary apparatus 200 for storing data. An illustration of electrical interface circuitry in FIG. 2 can be arranged alongside an illustration of memory in FIG. 3 for convenient review of the block diagram of apparatus 200.

The apparatus 200 comprises a memory 202. As described above in connection with FIG. 1, data is stored electrically in the memory 202. The memory 202 is allocated to reported memory portions 204 and overprovisioned portions 206 and bad portions 208. The reported memory portions 204 have a reported size that is reported to a host computer as usable memory. The overprovisioned memory portions 206 are not reported to a host computer as usable memory. Bad portions 208 are unusable either due to a manufacturing flaw or due to wear from multiple erasures during use.

The memory 202 is subject to wear after numerous program/erase (P/E) cycles. At the time that an existing file of stored data is updated to form an updated file, a reported memory portion that has been used to store the existing file can be re-allocated to become overprovisioned memory, and the newly updated file can be stored on an unused block of overprovisioned memory, which block of memory is then re-allocated to become reported memory. This process of re-allocating memory defers erasure of blocks of memory to a later time, and reduces wear due to program-erase (P/E) cycles. Reporting of memory size and re-allocation of memory is controlled by a memory allocation engine 236 (FIG. 2).

The apparatus 200 comprises an error correction circuit 210. The error correction circuit 210 generates error reports on line 212. The error correction circuit 210 communicates with the memory 202 in error correction coded data on line 214. The error correction coded data on line 214 has a controllable ECC length. The controllable ECC length is controlled by an ECC length input 216. The controllable ECC length is adjustable to meet the error correction needs of a particular limited address range of the memory 202, such as a page or a block. According to one aspect, the apparatus 200 comprises a host interface circuit 211 that communicates user data with a host computer (not illustrated). During a memory write operation, the error correction circuit 210 receives user data from the host interface circuit 211, encodes the user data with error correction coding, and provides error correction coded data on line 214 to the memory 202 for storage. During a memory read operation, the error correction circuit 210 receives error correction coded data from the line 214, decodes the error correction coded data, and provides user data to the host interface circuit 211.

The error correction circuit 210 comprises error correction encoding and decoding circuits 250, 252, 254. Some data that is read from the memory 202 is read with errors, and the error correction decoding circuit 210 corrects substantially all of the errors and provides substantially error free user data to the host interface 211. When read errors are found, the read errors are reported on line 212. The error correction circuit includes a plurality of ECC circuits 250, 252, 254. The ECC circuit 252 provides for error correction coding with a medium length. The ECC circuit 250 provides for error correction coding with a relatively higher length. The ECC circuit 254 provides for error correction coding with a relatively lower length. When a length of error correction coding is lower, error correction coded data can be stored in a relatively smaller portion of the memory 202, however, the error correction decoding is only able to correct errors at a relatively lower bit error rate (BER). When a length of error correction coding is higher, error correction coded data is stored in a relatively larger portion of the memory 202, however, the error correction decoding is capable of correcting errors at a relatively higher bit error rate (BER). Switches 256, 258 in the error correction circuit 210 route data through a medium, higher or lower length of error correction coding/decoding for each unit (such as a block or byte) of memory. The switches 256, 258 and the data routing are controlled by an ECC length command received at an ECC length input 216 in the error correction circuit 210. The error correction circuit 210 provides a selected length of error correction coding and decoding that is adequate for the bit error rate BER) of each block of memory in the memory 202. The selected ECC length is controlled by the ECC length command at the ECC length input 216. Each of the circuits 250, 252, 254 has the capability to provide both error correction encoding and error correction decoding, depending on whether a read or a write operation is being performed. Only one of the circuit 250, 252, 254 is active at any given time, depending on the selection of switches 256, 258.

The apparatus 200 comprises an ECC length update circuit 218. The ECC length update circuit 218 receives the error reports on line 212. According to one aspect, the ECC length update circuit 218 comprises an error history table 222. The error history table 222 stores a history of error reports. According to one aspect, the history of error reports stored in the error history table 222 comprise a running average of data in past error reports 212. According to another aspect, the ECC length update circuit 218 comprises an ECC length update computation block 224. The ECC length update computation block 224 computes an ECC length update 226 for each block of memory in the memory 202. The ECC length update circuit 218 provides the ECC length update 226 to an ECC length table 228 as a function of a history of the error reports 212. According to one aspect, the ECC length update circuit 218 calculates an ECC length update 226 that indicates a minimal ECC length needed to correct errors for a selected address range of the memory based on error reports 212 for the selected range of memory. The ECC length update 226 indicates an ECC length that is adequate for the bit error rate (BER) of a selected address range of the memory.

According to one aspect, the current ECC length 242 and the ECC length update 244, taken together, comprise a dual rank storage of ECC length data. According to another aspect, ECC length data is moved from the ECC length update 244 to the current ECC length 242 for a particular memory address range in synchronization with erasure of that particular memory address range. This ensures that a particular address memory range is read back using the same ECC length error correction code with which it was written.

According to one aspect, the memory 202 comprises multiple memory blocks such as memory blocks 1, 2, 3, 4 and 5. According to another aspect, the ECC length table 228 comprises a current ECC length 242 and the ECC length update 244 for each of the memory blocks such as memory blocks 1, 2, 3, 4 and 5. According to another aspect, the current ECC length 242 is updated by the ECC length update 244 as part of a block erase cycle. According to another aspect, the memory comprises memory pages; the ECC length table comprises a current ECC length and the ECC length update for each of the memory pages; and the current ECC length is updated by an ECC length update as part of a page erase cycle.

The apparatus 200 comprises an ECC length controller 230. The ECC length controller 230 accesses the ECC length table 228 along line 231. The ECC length controller 230 provides an ECC length command 232 to the ECC length input 216. The ECC length controller 230 receives address and control data from an address and control bus 234. The error correction and control circuit 210 receives address and control data from the address and control bus 234. The ECC length 232 that is provided to the error correction circuit 210 corresponds with the ECC length of a particular memory block in the memory 202 that is currently being accessed by the error correction circuit 210.

The apparatus 200 comprises a memory allocation engine 236. The memory allocation engine 236 accesses the ECC length table 228 along line 238. The memory allocation engine 236 balances a size of the overprovisioned portions 206 to maintain a size of the reported portions 204. The balancing is performed as a function of an average of ECC lengths in the ECC length table 228 over a time interval in which a size of the memory 202 decreases with accumulated erase cycles of the memory 202.

Figure 4:
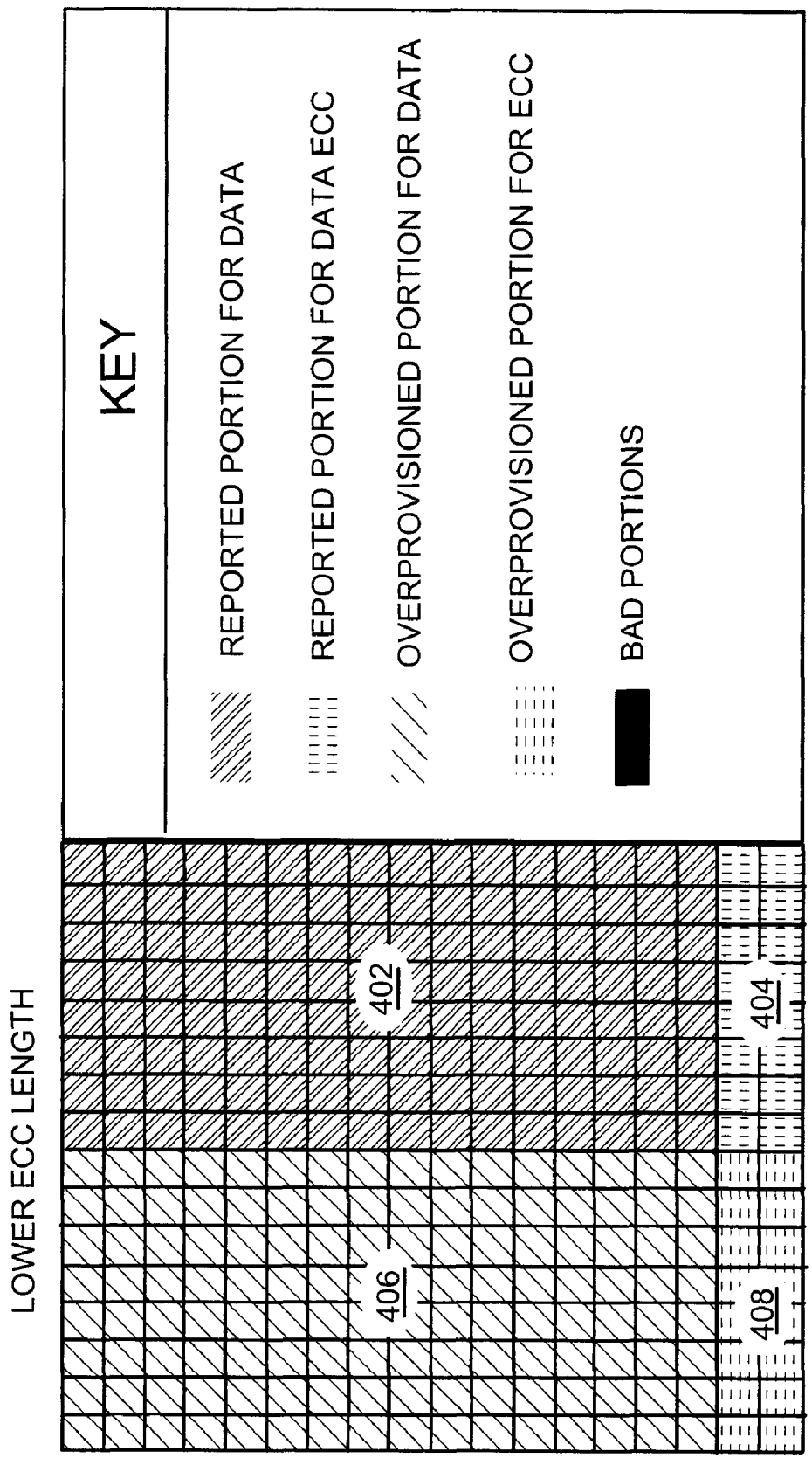
FIGS. 4-6 illustrate example allocations of a memory to data portions and overprovisioned portions with lower, medium and higher controllable ECC lengths in error correction coded data.
Figure 5:
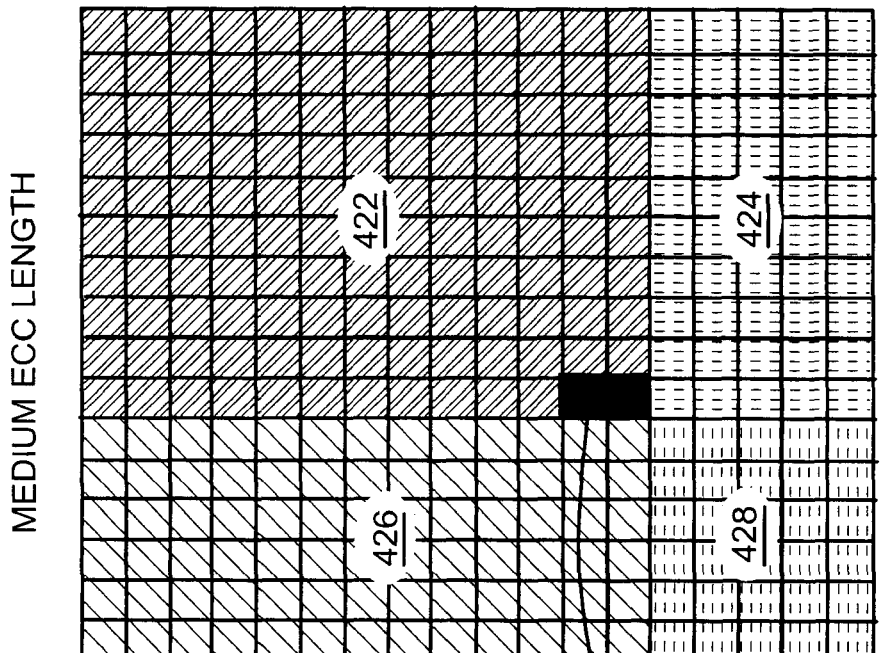
Figure 6:
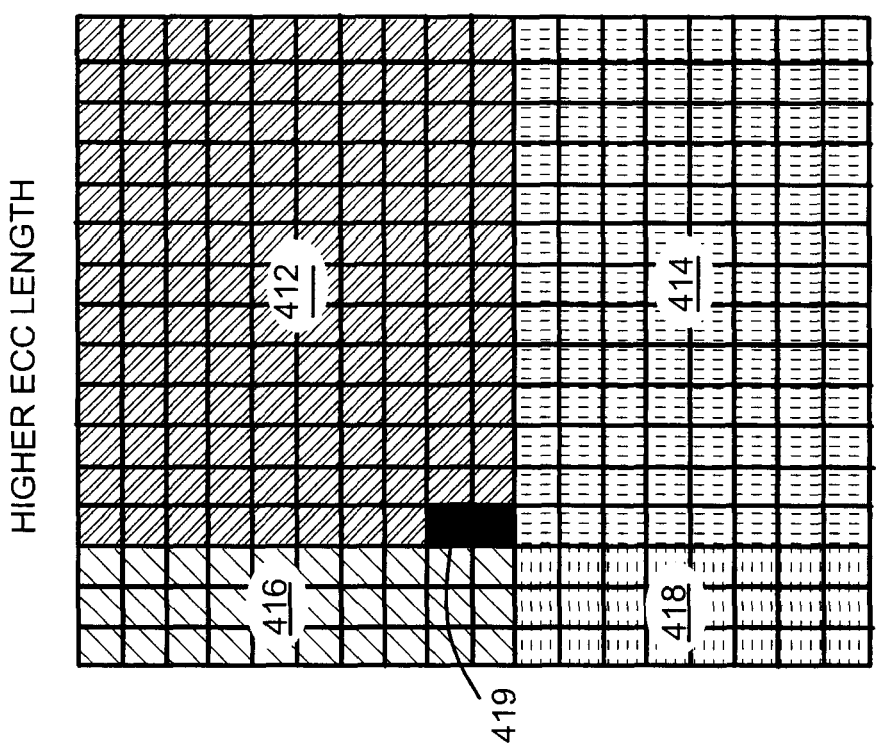

FIGS. 4, 5 and 6 illustrate examples of memory allocations in a memory such as the memory 202. For ease of visualization, the examples illustrated in FIGS. 4, 5 and 6 are simplified examples in which all the memory in each example has the same ECC length and is mapped in contiguous blocks, and the error correction coding is shown separately from data or overprovisioned portions. It will be understood that in an actual memory different blocks will have differing amounts of wear, different bit error rates and different lengths of error correction coding. It will also be understood that in an actual memory, allocation is typically not in contiguous blocks, but is non contiguous. It will also be understood that, with some types of error correction coding, ECC bits are not distinct from data bits, for example in convolutional error correction coding. FIGS. 4, 5 and 6 serve to illustrate the effect of ECC length on the relative sizes of reported portion, overprovisioned portion and ECC coding portions. A KEY illustrated in FIG. 4 identifies the relative size of memory utilized by various allocated memory portions in FIGS. 4, 5 and 6.

In FIG. 4, lower length error correction coding is used, 12% of the memory is used up by error correction coding 404, 408. 44% of the memory is allocated for reported data 412, 44% of the memory is allocated and available for overprovisioned data 406. When the memory is new and has been used very little, lower length error correction coding is adequate for successful error correction, and a large amount of space for overprovisioned data 406 is available as illustrated in FIG. 4. In FIG. 4, the large amount of overprovisioned data space allows for long deferrals of erasures, thus extending the life of the memory. Optimum use of the new memory is made in FIG. 4 by using lower length error correction coding and long deferrals of erasures.

In FIG. 5, medium length error correction coding is used, 28% of the memory is used up by error correction coding 424, 428, and 1% of the memory is used up by bad portions 429. 44% of the memory is allocated for reported data 422, and 27% is left to be allocated for overprovisioned data (426). The remaining 29% of the memory is used up by error correction coding (28%) and bad portions (1%). When the memory is moderately worn, as in FIG. 5, and errors have increased moderately, medium length error correction coding is adequate for successful error correction, and a medium amount of space (27%) for overprovisioned data 406 is available. In FIG. 5, the medium amount of overprovisioned data space allows for medium length deferrals of erasures, thus extending the life of the memory a moderate amount. Optimum use of the new memory is made in FIG. 5 by using medium length error correction coding and medium deferral times for of erasures.

In FIG. 6, for example, higher length error correction coding is used, 45% of the memory is used up by error correction coding 414, 418, and 1% of the memory is used up by bad portions 419. 44% of the memory is available for reported data 412 and only 10% is available for overprovisioned data 416. When the memory is greatly worn, and has been used a large amount, higher length error correction coding is needed for successful error correction, and a small amount of space for overprovisioned data 406 is available. In FIG. 4, the large amount of overprovisioned data space allows for long deferrals of erasures, thus extending the life of the memory. Optimum use of the greatly worn memory is made in FIG. 6 by using higher length error correction coding and short deferral times for erasures.

It can be seen from FIGS. 4, 5 and 6, that as the memory ages with program/erase (P/E) cycles, the amount of space available to be allocated to overprovisioned data drops from 44% (new) to 27% (medium) to 10% (greatly worn) as the length of error correction coding is varied to provide a minimum length of error correction coding needed to correct errors. This strategy of varying the length of error correction coding extends the life of the memory by optimally reducing wear as the memory ages with use.

While the examples illustrated in FIGS. 4, 5 and 6 are simplified examples in which the ECC length is the same for all pages, blocks or address ranges at a particular time in the life of the memory, it will be understood that ECC length is typically not the same for all pages, blocks or address ranges and that ECC length at any particular time in the life of the memory is different for different pages, blocks or address ranges, and the same strategy of varying ECC length extends the life of the memory by optimally reducing wear for each page, block or range.

Figure 7:
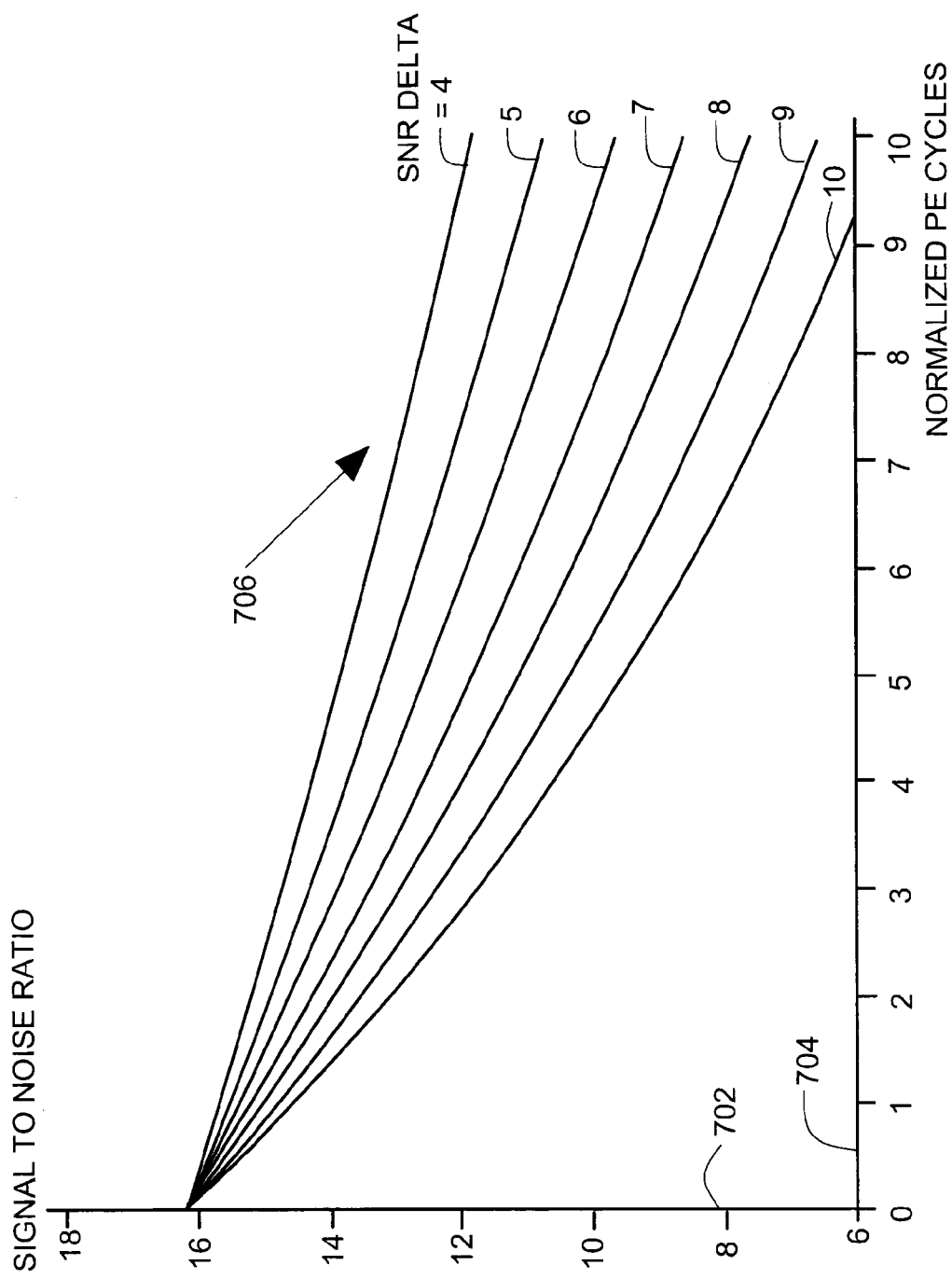
FIG. 7 illustrates an exemplary graph of expected signal to noise ratios (SNR) of data in a memory as a function of normalized program/erase (PE) cycles for SNR DELTA parameters in the range of 4 to 10.

FIG. 7 illustrates an exemplary graph of expected signal to noise ratios (SNR) of data in a memory as a function of normalized program/erase (P/E) cycles for SNR DELTA parameters in the range of 4 to 10. The SNR DELTA parameter is an expected exponential degradation rate in SNR. A 1 dB increment of change in SNR DELTA is associated with a 1 bit increment in length of error correction code. A vertical axis 702 represents expected SNR and a horizontal axis 704 represents normalized P/E cycles. A family of parametric curves 706 represents expected degradation of SNR as the expected degradation rate SNR DELTA is varied from 4 to 10. The degradation rate of a memory is measured experimentally and then matched to one of the parametric curves 706 in order to select a range of ECC lengths that will correct expected errors throughout the useful life of the memory. According to one aspect, the curves 706 are a function of an equation:

$$SNR = (SNR0)e^{-((SNR\ DELTA) \times (P/E\ CYCLES))} \quad \text{Equation 1}$$

where SNR0 is a scaling constant.

Figure 8:
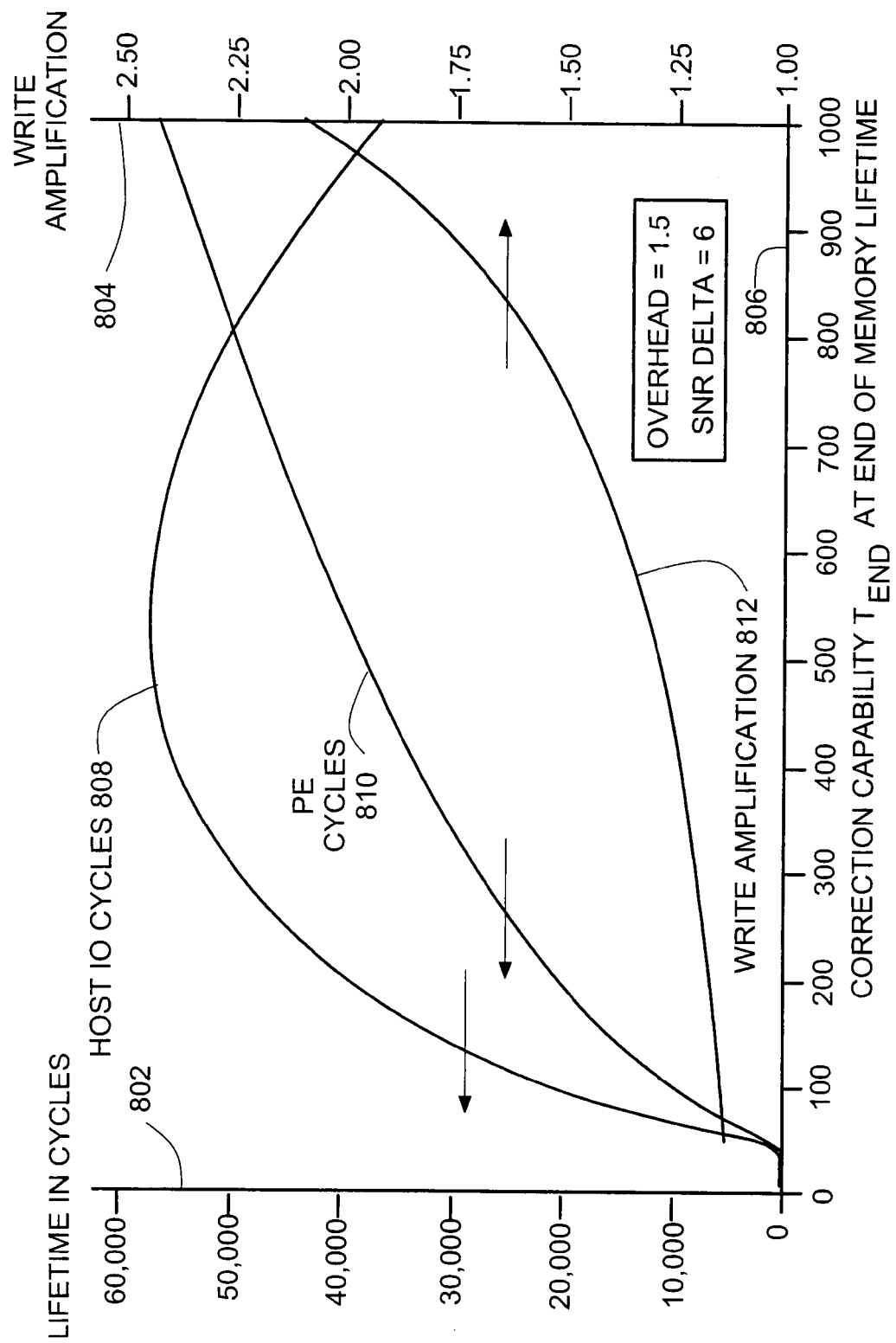
FIG. 8 illustrates an exemplary graph of host IO cycles, PE cycles and write amplification as a function of correction capability T under conditions where an overhead is 1.5 and an SNR Delta is 6.

FIG. 8 illustrates an exemplary graph of host IO cycles, P/E cycles and write amplification as a function of correction capability T under conditions where an overhead is 1.5 and an SNR Delta is 6. Correction capability T is a maximum number of bit errors in a block of memory that can be corrected using a Bose-Chaudhuri-Hocquenghem (BCH) code for error correction. Overhead is a portion of memory storage space that is unavailable for data because it is consumed by the error correction coding and by overprovisioning. Overhead includes both ECC overhead and overprovisioning overhead. SNR Delta is an expected exponential degradation rate in SNR.

Electronic apparatus for the storage of data moves data to either equalize wear among all the storage elements in the device or to consolidate the used locations to free up space for new data. Moving data requires additional writes using up available bandwidth and increasing wear. It is therefore desirable to minimize the number of additional writes incurred by moving data. Write amplification is defined as a ratio of a total number of writes to the number of host writes. Write amplification approaches one with a very small number of additional writes.

A left vertical axis 802 represent a number of cycles, either host IO cycles 808 or P/E cycles 810. A right vertical axis 804 represents a write amplification ratio 812. A horizontal axis 806 represents correction capability T. It can be seen by inspection of FIG. 8 that write amplification 812 increases with increasing correction capability. A higher correction capability T uses more overhead at the expense of overprovisioning. A maximum number of P/E cycles increases monotonically with T, but so does the write amplification. At very high values of T, the write amplification penalty dominates. The number of host IO cycles represents a balance between P/E cycles and write amplification.

Figure 9:
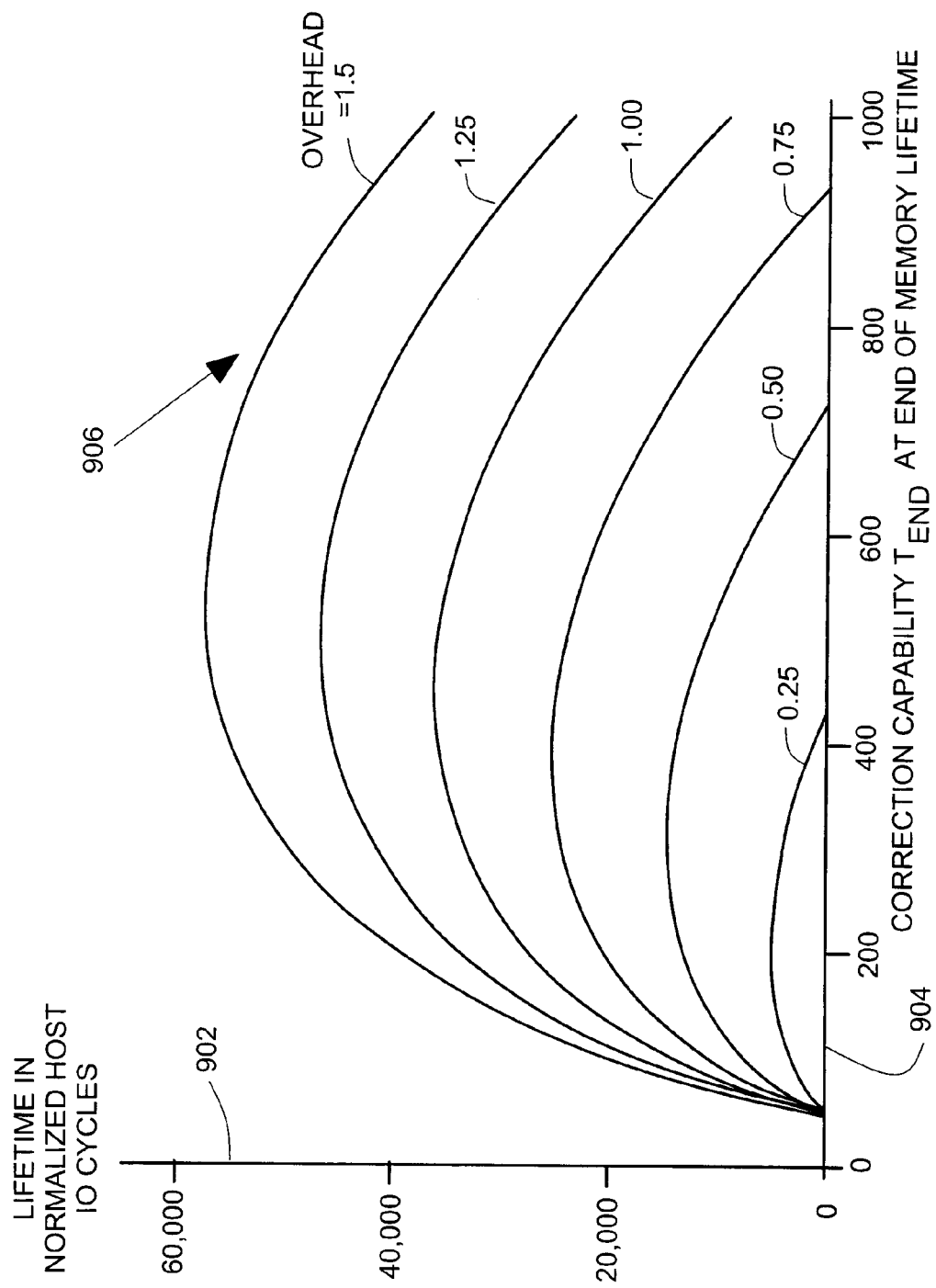
FIG. 9 illustrates an exemplary group of curves of normalized host write cycles in a memory lifetime as a function of correction capability T, with overhead in the range of 0.25 to 1.5 as a parameter.

FIG. 9 illustrates an exemplary group of curves of normalized host write cycles in a memory lifetime as a function of correction capability T, with overhead in the range of 0.25 to 1.5 as a parameter. A vertical axis 902 represents normalized host write cycles, and a horizontal axis 904 represents correction capability T. A group of parametric curves 906 represents normalized host write cycles as a function of correction capability T with overhead as a parameter. FIG. 9 illustrates how a lifetime or endurance of a memory is affected by overhead and correction capability T.

Figure 10:
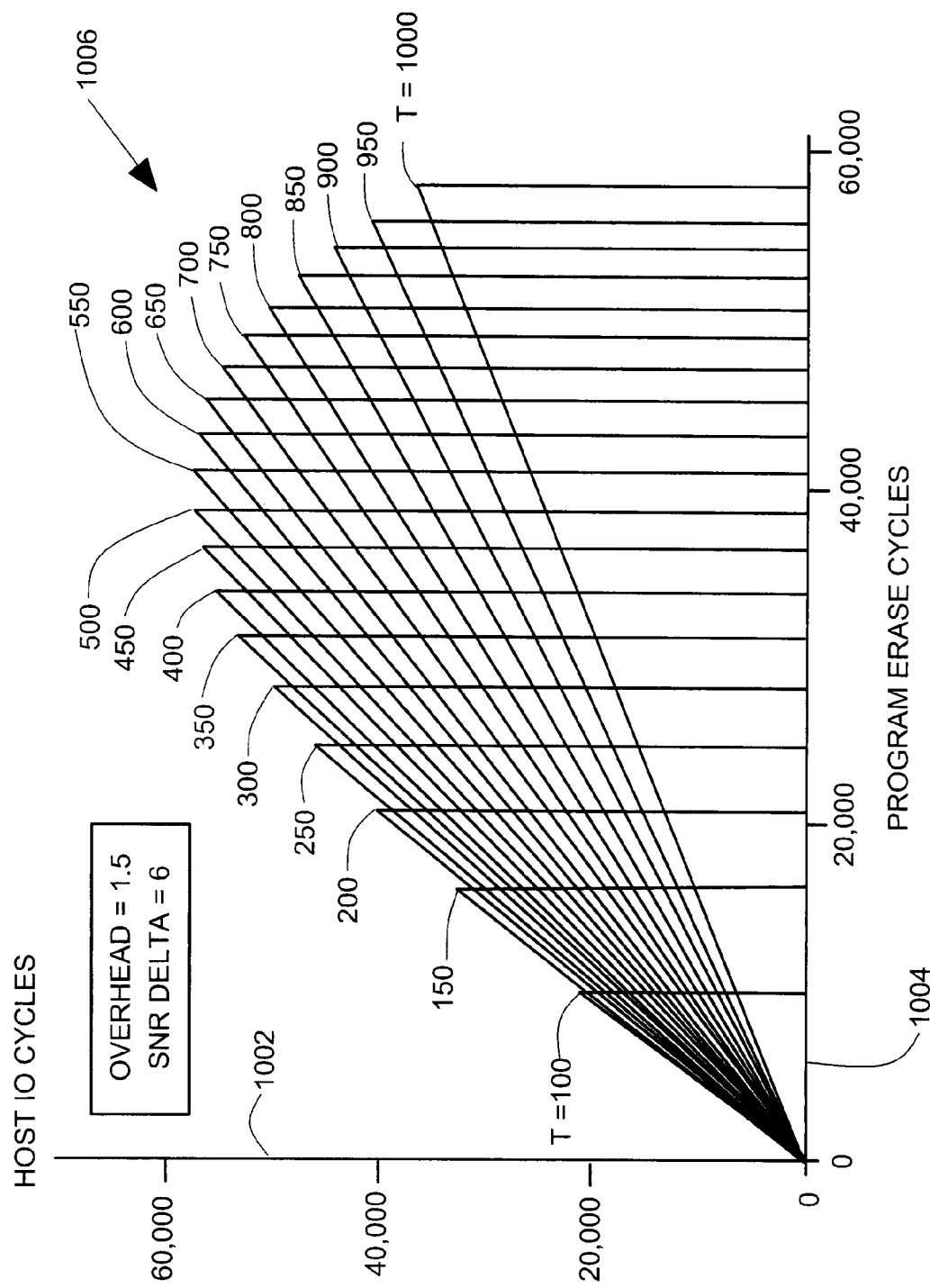
FIG. 10 illustrates an exemplary group of curves of host IO cycles as a function of program/erase (P/E) cycles in a memory lifetime with correction capability T in a range of 100 to 1000 as a parameter, and with overhead equal to 1.5 and SNR Delta equal to 6.

FIG. 10 illustrates an exemplary group of curves of host IO cycles as a function of program/erase (P/E) cycles in a memory lifetime with correction capability T in a range of 100 to 1000 as a parameter, and with overhead equal to 1.5 and SNR Delta equal to 6. A vertical axis 1002 represents host IO cycles and a horizontal axis 1004 represents P/E cycles. A group of parametric curves 1006 represents host IO cycles as a function of P/E cycles with correction capability T in a range of 100 to 1000 as a parameter. It can be seen by inspection of FIG. 10 that memory lifetime is limited by a number of P/E cycles, but the number of P/E cycles is controllable by setting correction capability T. It can also be seen by inspection of FIG. 10 that, during a memory lifetime, a ratio of host IO cycles to P/E cycles is controllable by setting the parameter correction capability T.

Figure 11:
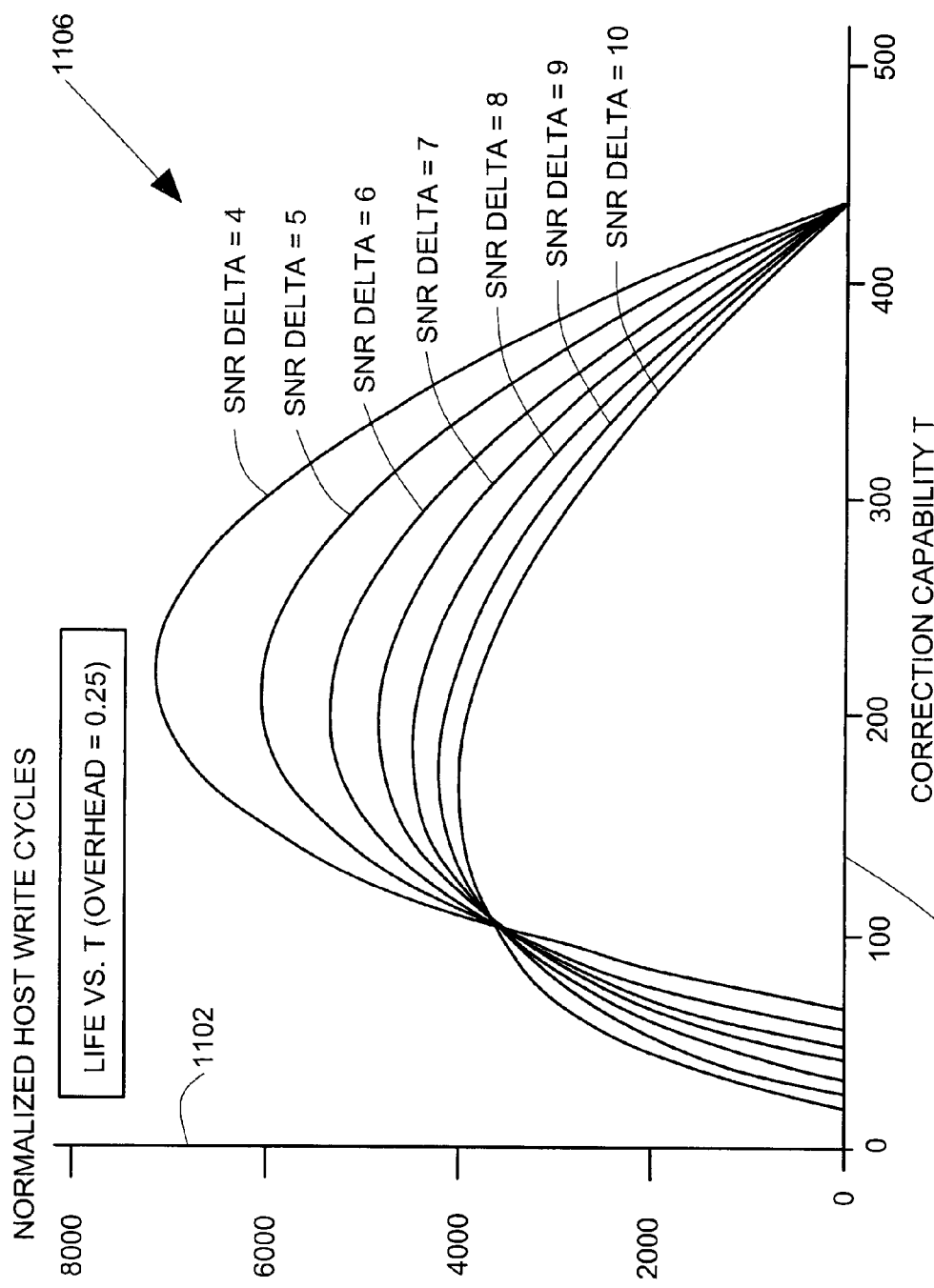
FIG. 11 illustrates an exemplary group of parametric curves of normalized host write cycles as a function of correction capability T with an SNR DELTA in a range of 4 to 10 as a parameter, and with overhead=0.25.

FIG. 11 illustrates an exemplary group of parametric curves of normalized host write cycles as a function of correction capability T with an SNR DELTA in a range of 4 to 10 as a parameter, and with overhead=0.25. A vertical axis 1102 represents normalized host write cycles and a horizontal axis 1104 represents correction capability T. A group of parametric curves 1106 represent normalized host write cycles as a function of correction capability T with SNR DELTA as a parameter. It can be seen by inspection of FIG. 11 that benefits of higher correction capability T diminish with low total overhead and a high SNR vs. P/E cycle slope.

Figure 12:
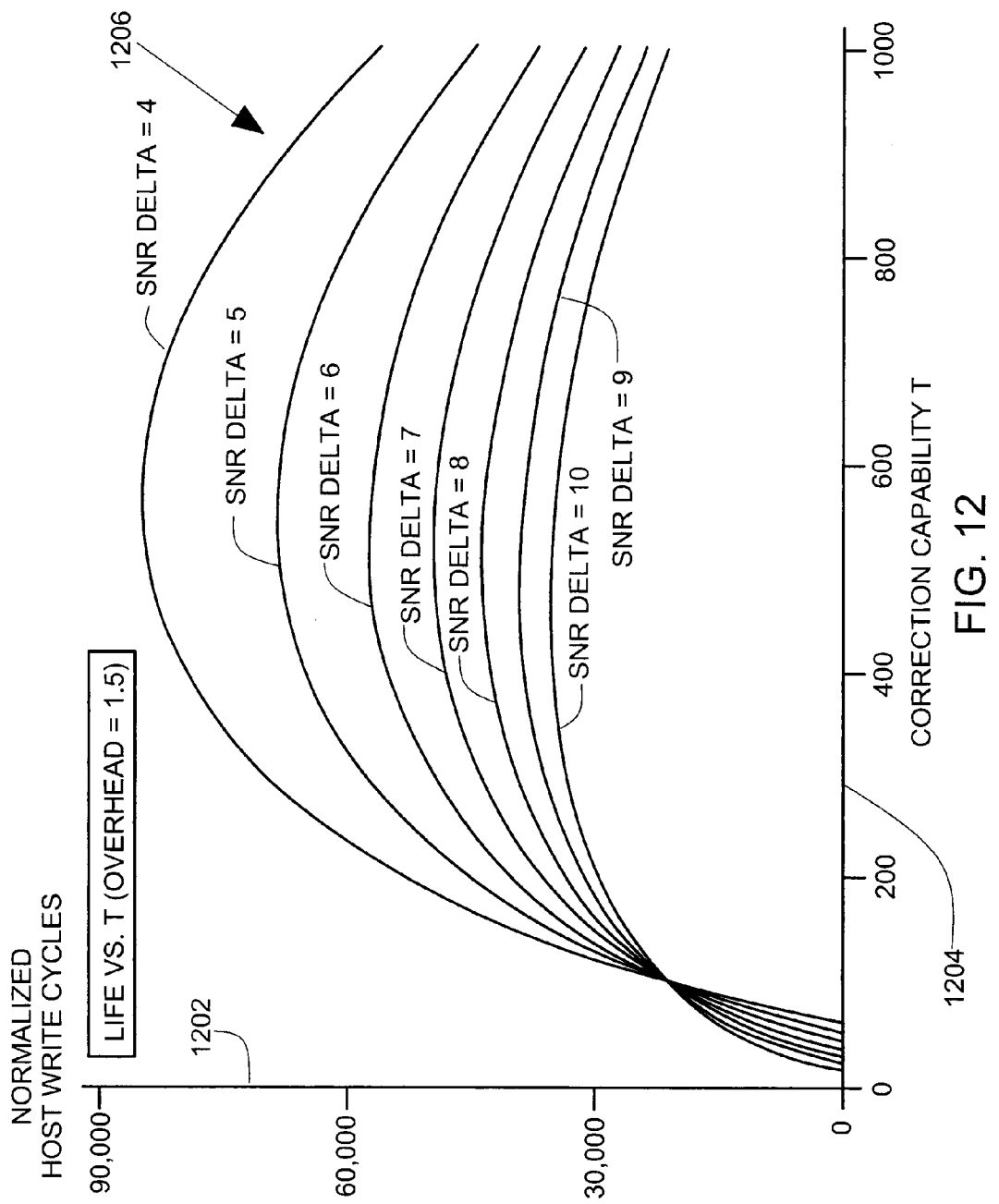
FIG. 12 illustrates an exemplary group of parametric curves of normalized host write cycles as a function of correction capability T with an SNR DELTA in a range of 4 to 10 as a parameter, and with overhead=1.5.

FIG. 12 illustrates an exemplary group of parametric curves of normalized host write cycles as a function of correction capability T with an SNR DELTA in a range of 4 to 10 as a parameter, and with overhead=1.5. A vertical axis 1202 represents normalized host write cycles and a horizontal axis 1204 represents correction capability T. A group of parametric curves 1206 represent normalized host write cycles as a function of correction capability T with SNR DELTA as a parameter. FIG. 12 is comparable to FIG. 11 except that the overhead is increased to 1.5 in FIG. 12. A comparison of FIGS. 11 and 12 illustrates the qualitative effect of overhead lifetime in terms of host write cycles.

Figure 13:
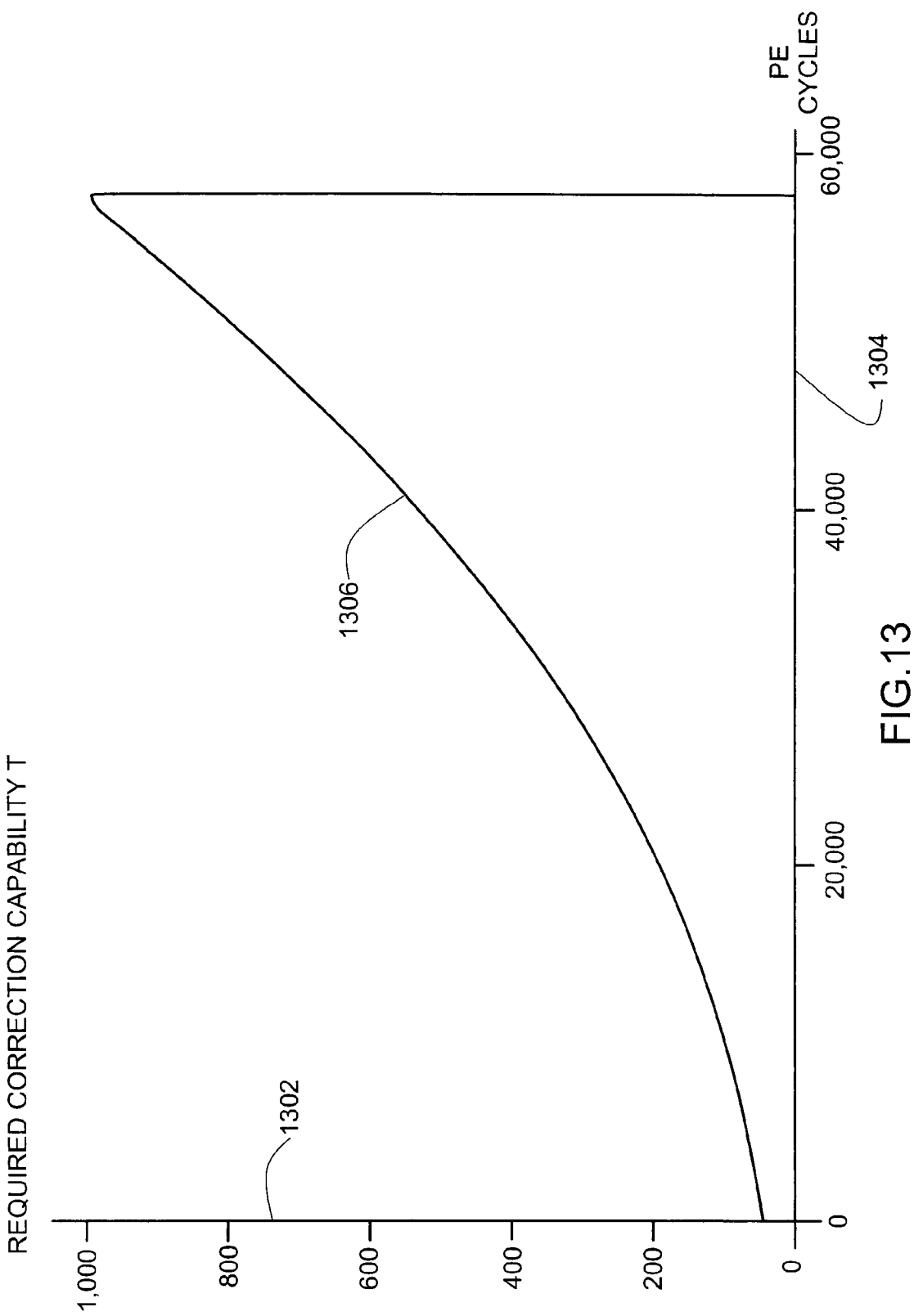
FIG. 13 illustrates an exemplary graph of minimum required correction capability T as a function of P/E cycles.

FIG. 13 illustrates an exemplary graph of minimum required correction capability T as a function of P/E cycles. A vertical axis 1302 represents minimum required correction capability T, and a horizontal axis 1304 represents a number of P/E cycles. A curve 1306 represents minimum required correction capability T as a function of P/E cycles. Since the SNR degrades with P/E cycles, the correction capability T also increases with P/E cycles. A constant correction capability T over a lifetime of a memory wastes overhead that can be used to reduce write amplification. In FIG. 13, correction capability is varied over the lifetime of the memory to optimize lifetime and overprovisioning.

Figure 14:
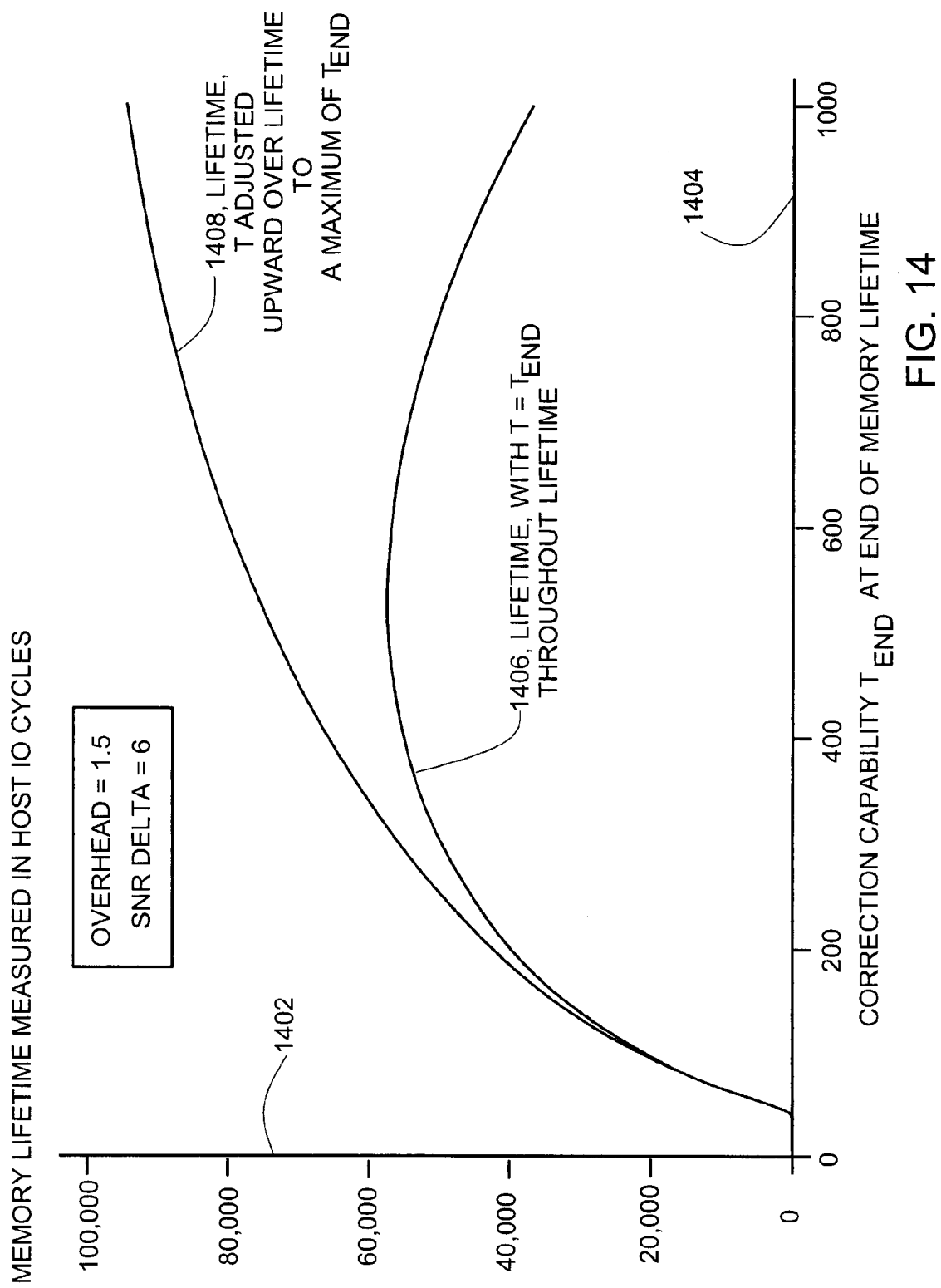
FIG. 14 illustrates an exemplary graph of memory lifetime in host IO cycles as a function of correction capability $T_{END}$, at an end of the memory lifetime.

FIG. 14 illustrates an exemplary graph of memory lifetime in host IO cycles as a function of correction capability $T_{END}$, at an end of the memory lifetime. A vertical axis 1402 represents memory lifetime measured in a number of host IO cycles. A horizontal axis 1404 represents correction capability $T_{END}$ at an end of a memory lifetime. A curve 1408 represents memory lifetime when correction capability T is adjusted upward in steps as the memory wears and bit error rate increases over the lifetime of the memory. A curve 1406 represents memory lifetime when correction capability T is set at a constant value $T_{END}$ throughout the lifetime of the memory. In the example shown in FIG. 14, SNR Delta=6 and overhead=1.5. It can be seen by inspection of FIG. 14 that memory lifetime, in terms of a number of host IO cycles, is increased by adjusting T upward in steps as the memory wears. T is adjusted upward in steps by increasing ECC length of error correction codes in steps.

Figure 15:
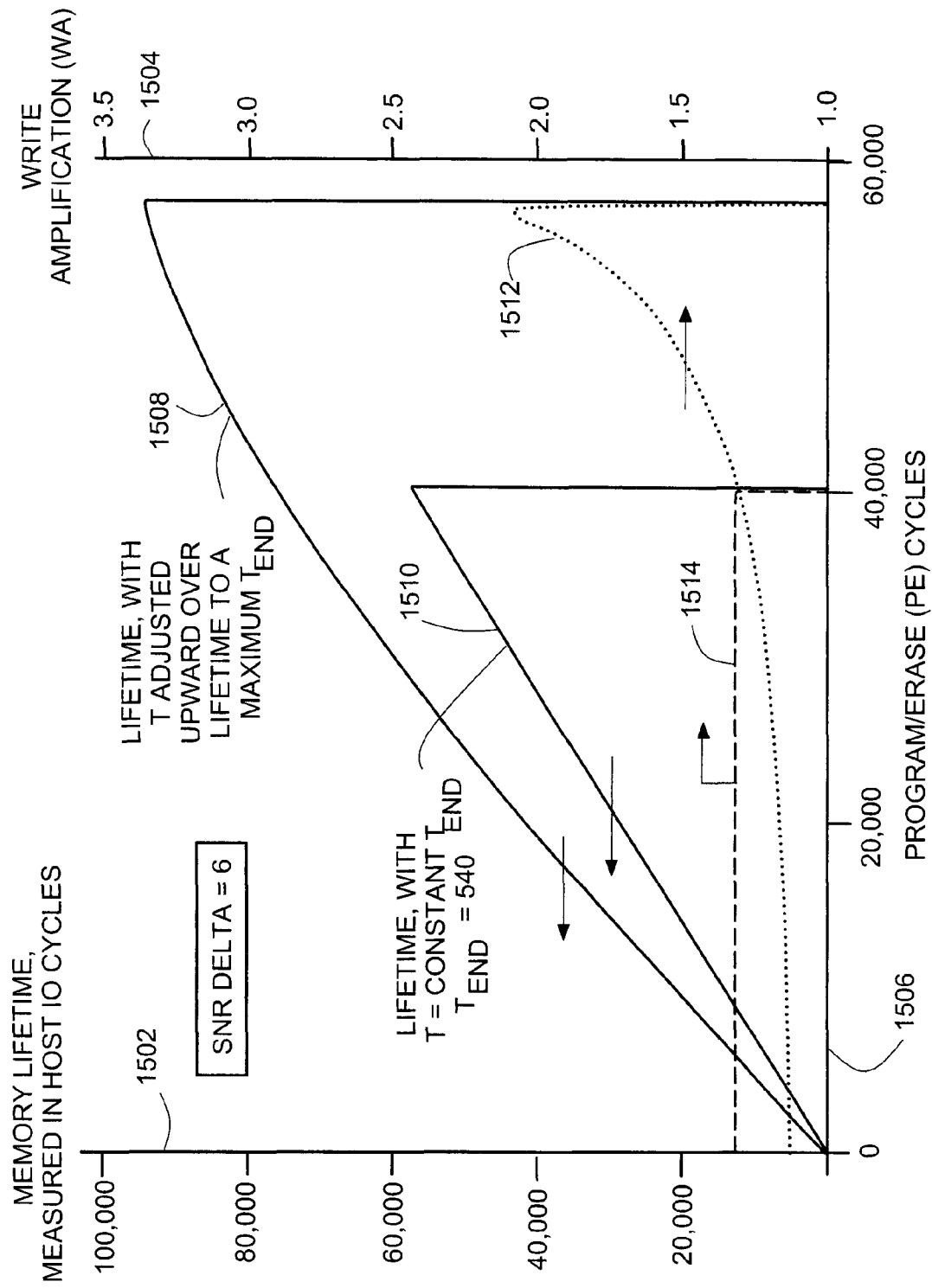
FIG. 15 illustrates an exemplary graph of lifetime, measured in host IO cycles and write amplification (WA) as function of program/erase (P/E) cycles.

FIG. 15 illustrates an exemplary graph of lifetime, measured in host IO cycles and write amplification (WA) as function of program/erase (P/E) cycles. A first vertical axis 1502 represents memory lifetime measured in a number of host IO cycles. A second vertical axis 1504 represents write amplification factor. A horizontal axis 1506 represents a number of program/erase cycles. A first curve 1508 represents lifetime with correction capability T adjusted upward in steps over the lifetime to a maximum correction capability $T_{END}$. A second curve 1510 represents lifetime with correction capability T at a constant value $T_{END}$ over the lifetime. A third curve 1512 represents write amplification WA with T adjusted upward in steps over the lifetime as shown on the first curve 1508. A fourth curve 1514 represents write amplification WA with T constant as shown on the second curve 1510. Comparison of curves 1508, 1510 in FIG. 15 illustrates that the adjustment of T over the lifetime of the memory increases the number of host IO cycles that are possible over the life of the memory.

Figure 16:
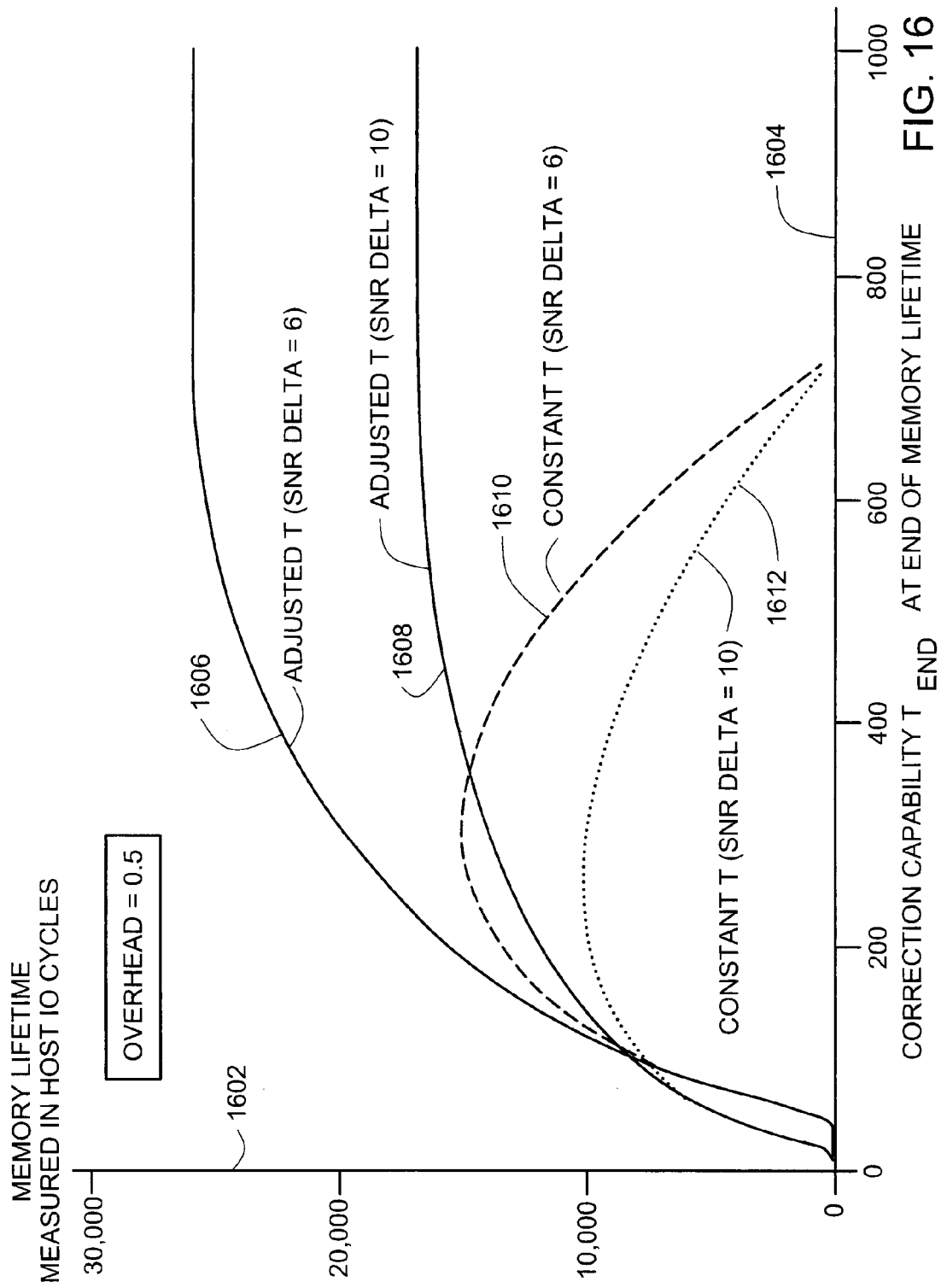
FIG. 16 illustrates an exemplary graph of lifetime measured in host IO cycles as a function of maximum correction capability $T_{END}$. A vertical axis 1602 represents lifetime measured in a number of host IO cycles.

FIG. 16 illustrates an exemplary graph of lifetime measured in host IO cycles as a function of maximum correction capability $T_{END}$. A vertical axis 1602 represents lifetime measured in a number of host IO cycles. A horizontal axis 1604 represents maximum correction capability $T_{END}$ with SNR Delta values of either 6 or 10, and either a constant $T=T_{END}$, or a T that is adjusted upward in steps over the memory lifetime to $T_{END}$. A first curve 1606 represents memory lifetime with T adjusted upward over the memory lifetime to TEND, and SNR DELTA=6. A second curve 1608 represents lifetime with T adjusted upward over the memory lifetime to TEND, and SNR DELTA=10. A third curve 1610 represents lifetime with T constant and SNR DELTA=6. A fourth curve 1612 represents lifetime with T constant and SNR DELTA=10. SNR DELTA and total overhead have a significant impact on the benefits of an error correction code with a longer ECC length. With a higher SNR DELTA, the same SNR gain yields a smaller increase in P/E cycles, making it favorable to increase P/E cycles by reducing, write amplification. With a high overhead, the incremental benefits of using more of the overhead to reduce write amplification diminishes, and this increases the relative benefit of using overhead to increase T.

Figure 17:
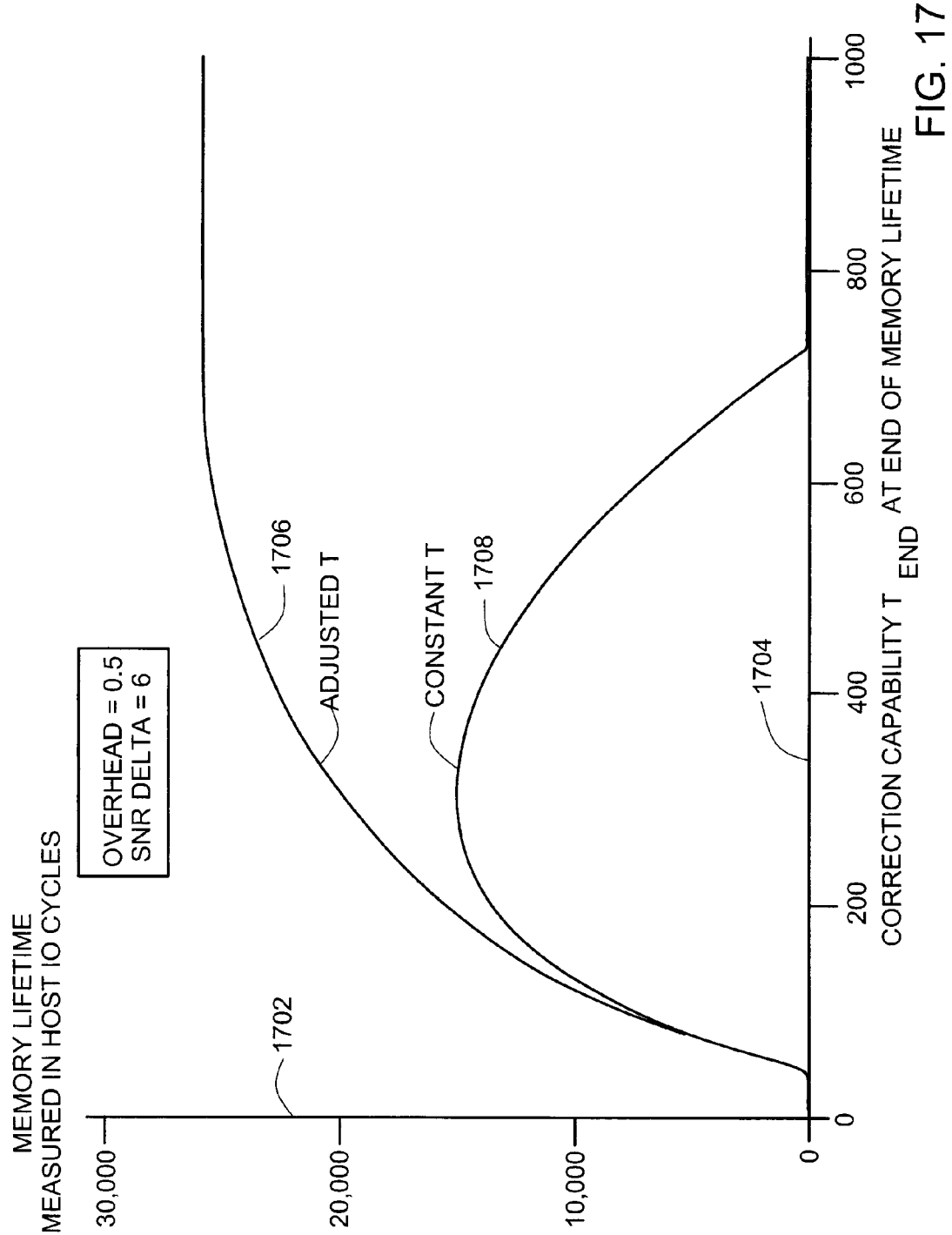
FIG. 17 illustrates an exemplary graph of memory lifetimes measured in host IO cycles as a function of correction capability $T_{END}$ at an end of the memory lifetime with overhead=0.5 and SNR DELTA=6.

FIG. 17 illustrates an exemplary graph of memory lifetimes measured in host IO cycles as a function of correction capability $T_{END}$ at an end of the memory lifetime with overhead=0.5 and SNR DELTA=6. A vertical axis 1702 represents lifetime, and a horizontal axis 1704 represents correction capability $T_{END}$. A first curve 1706 represents lifetime with T adjusted upward over the memory lifetime, and a second curve 1708 represents lifetime with a constant $T=T_{END}$.

Figure 18:
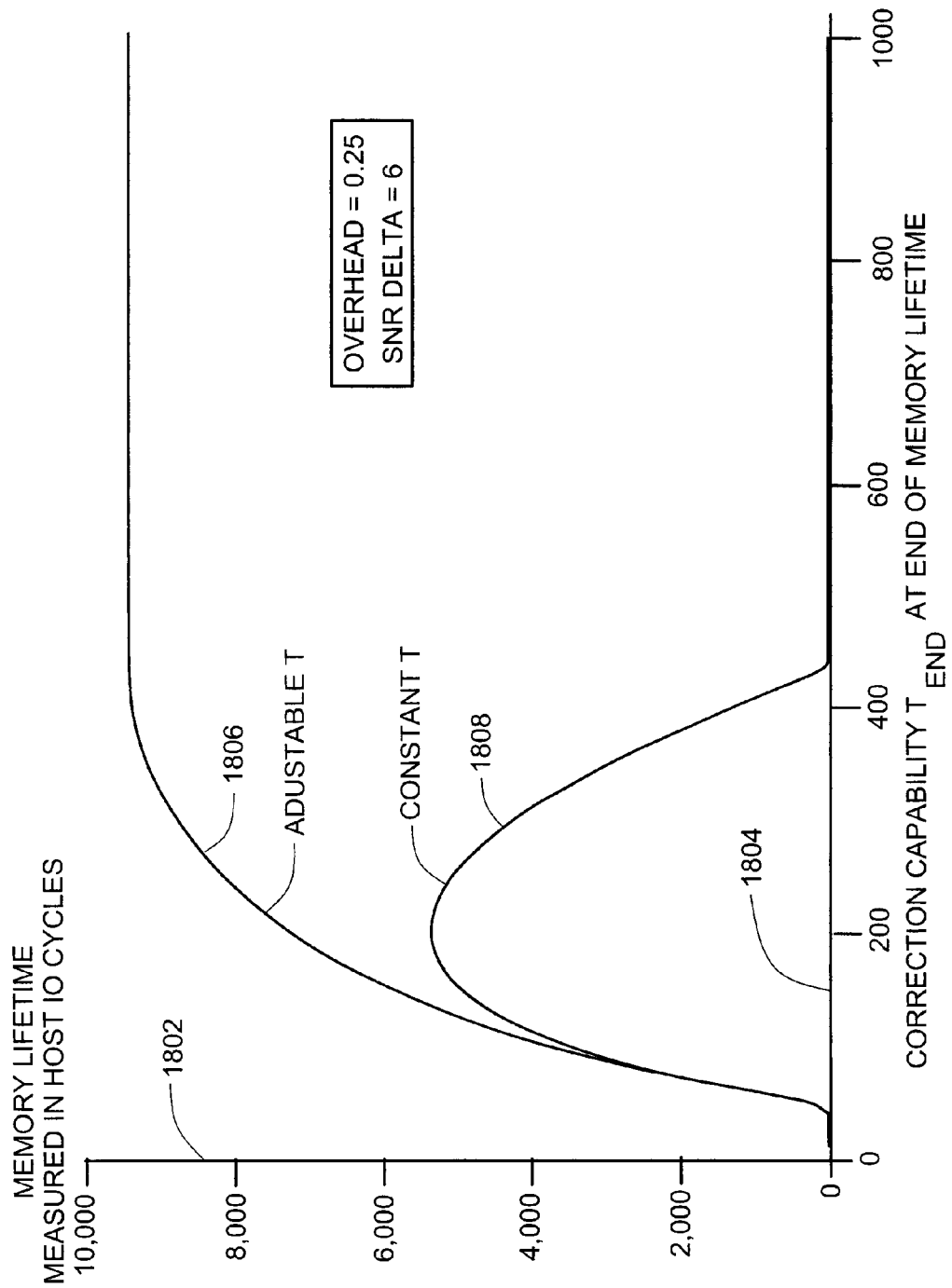
FIG. 18 illustrates an exemplary graph of memory lifetimes measured in host IO cycles as a function of correction capability $T_{END}$ at an end of the memory lifetime with overhead=0.25 and SNR DELTA=6.

FIG. 18 illustrates an exemplary graph of memory lifetimes measured in host IO cycles as a function of correction capability $T_{END}$ at an end of the memory lifetime with overhead=0.25 and SNR DELTA=6. A vertical, axis 1802 represents lifetime, and a horizontal axis 1804 represents correction capability $T_{END}$. A first curve 1806 represents lifetime with T adjusted upward over the memory lifetime, and a second curve 1808 represents lifetime with a constant $T=T_{END}$.

Figure 19:
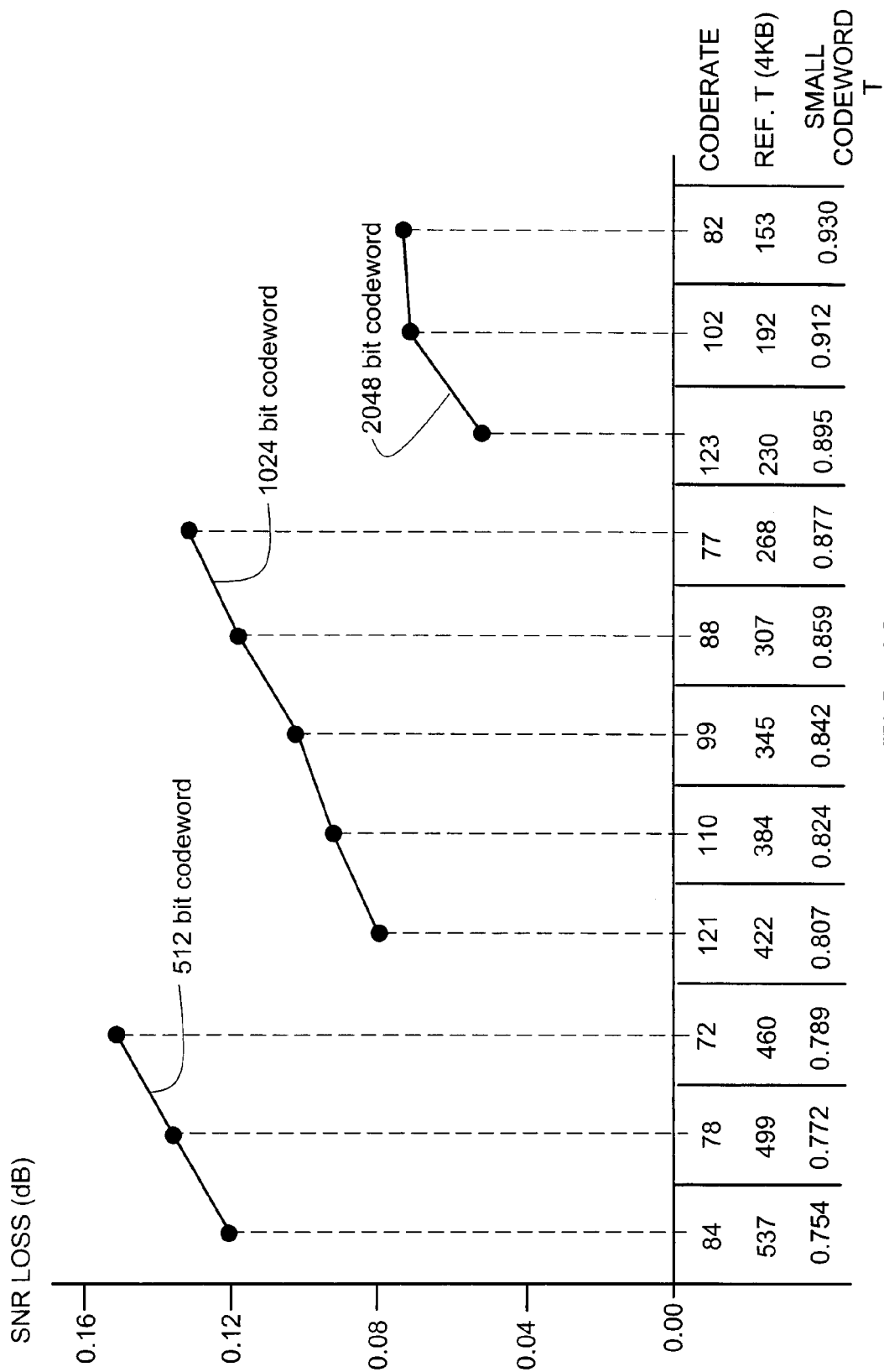
FIG. 19 illustrates an exemplary chart of SNR loss, in decibels (dB) for codewords of size 512 bit, 1024 bit, and 2048 bit.

FIG. 19 illustrates an exemplary chart of SNR loss, in decibels (dB) for codewords of size 512 bit, 1024 bit, and 2048 bit. As illustrated in FIG. 19, use of smaller code words can be considered to overcome the practical limitations of implementing a very high $T_{END}$. The chart shows the SNR loss of using multiple smaller code words versus a single 4 KB code word.

Figure 20:
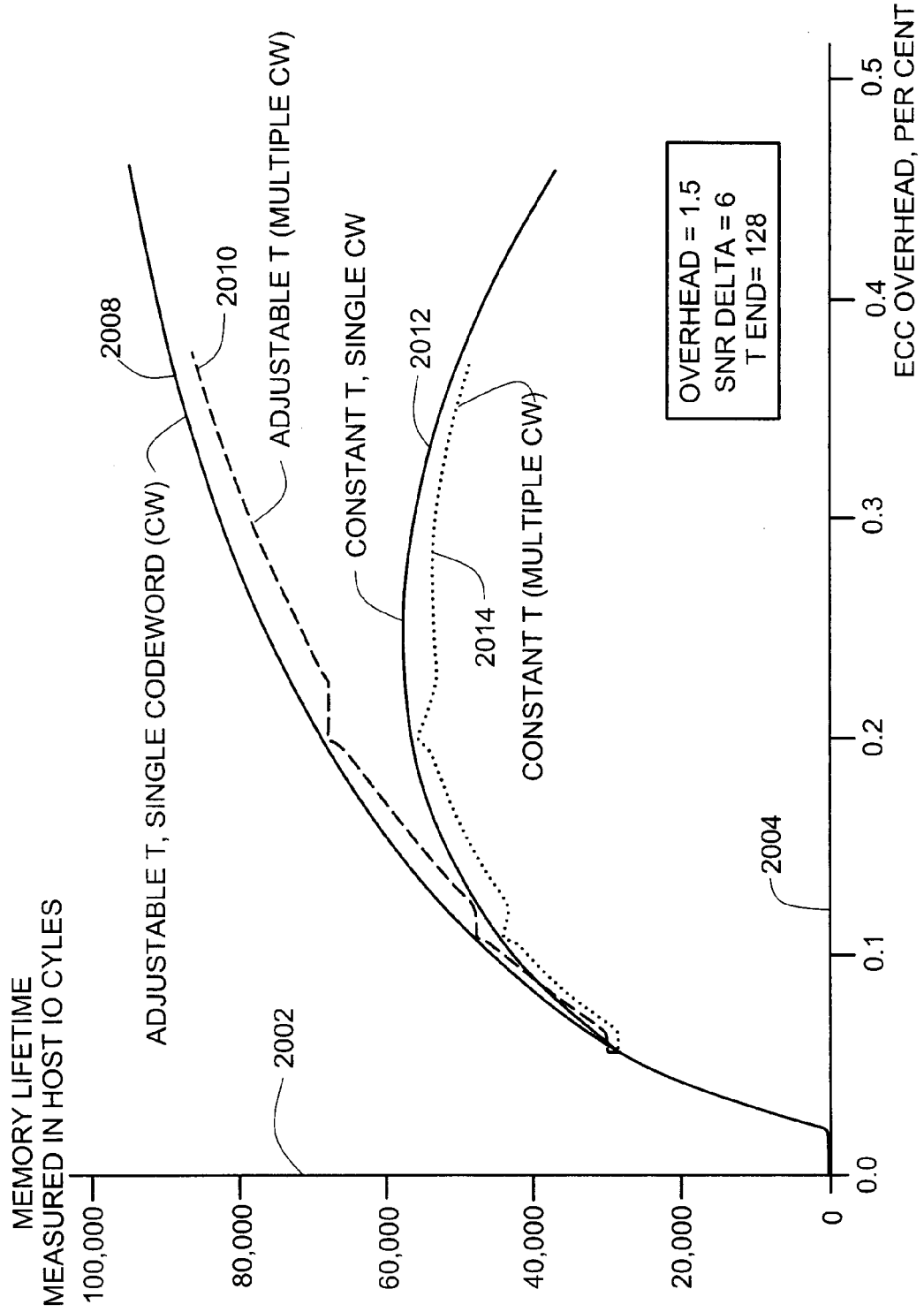
FIG. 20 illustrates an exemplary graph of memory lifetimes as a function of percent ECC overhead for adjustable T, constant T, and single and multiple codewords.

FIG. 20 illustrates an exemplary graph of memory lifetimes as a function of percent ECC overhead for adjustable T, constant T, and single and multiple codewords. A vertical axis 2002 represents memory lifetime. A horizontal axis represents ECC overhead in percent. A first curve 2008 represents a lifetime with adjustable T, and single codewords. A second curve 2010 represents a lifetime with adjustable T and multiple codewords. A third curve 2012 represents a lifetime with constant T and single codewords. A fourth curve represents a lifetime with constant T and multiple codewords.

Figure 21:
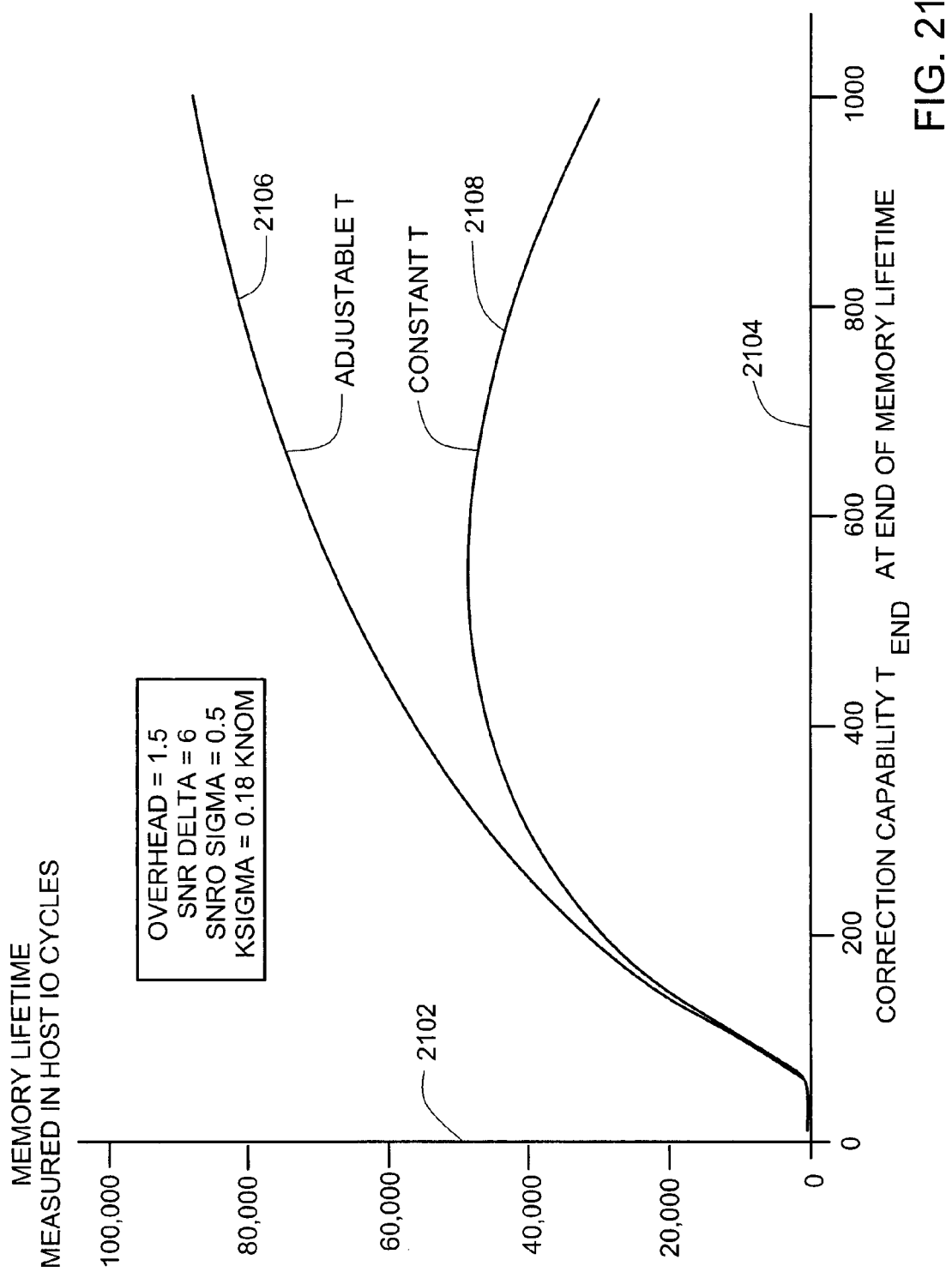
FIG. 21 illustrates an exemplary graph of memory lifetimes as a function of correction capability $T_{END}$.

FIG. 21 illustrates an exemplary graph of memory lifetimes as a function of correction capability $T_{END}$. A vertical axis 2102 represents lifetimes. A horizontal axis 2104 represents correction capability $T_{END}$. A first curve 2106 represents lifetime with an adjustable T. A second curve 2108 represents lifetime with a constant T. In FIG. 21, the overhead is 1.5, the SNR DELTA is 6, SNR0 SIGMA is 0.5 and KSIGMA is 0.18 KNOM. SNR variability from page to page increases the benefits of using an adjustable T. With constant T, the UER is dominated by the tail of the SNR distribution. Helping the tail with additional ECC uses up less overhead that equal addition ECC for the whole distribution.

Figure 22:
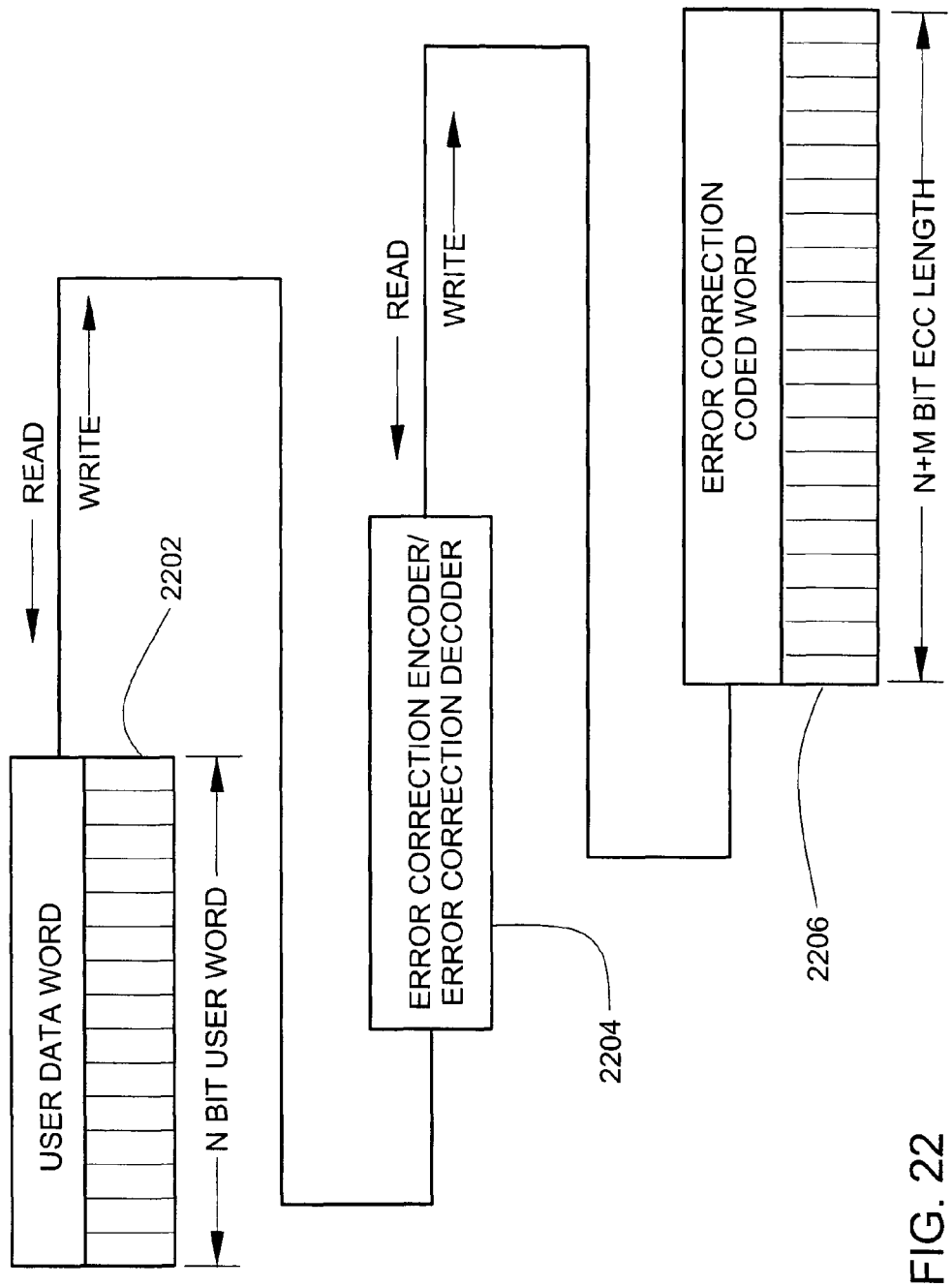
FIG. 22 illustrates an example ECC length of an error correction coded word and a length of a corresponding user data word.

FIG. 22 illustrates an example of a user data word 2202 at a host side of an error correction circuit 2204 (such as error correction circuit 210 in FIG. 2) with a length of N bits, and a corresponding example of an error correction coded word 2206 at a memory side of the error correction circuit 2204 with an ECC length of N+M bits. The ECC length N+M is longer than the data word length N by an additional M bits. The additional length provided with the error correction coded word 2206 provides redundancy for user in error correction decoding by the error correction circuit 2204 during a read cycle.

ECC and overprovisioning increase lifetime by helping to recover degraded data or by reducing wear. For a fixed total overhead, increased ECC capability comes at the expense of write amplification, and vice versa. For a wide range of conditions, ECC capability with T greater than 100 (for a 4 KB page) can significantly improve lifetime. The ECC gain diminishes as the rate of SNR degradation with P/E cycles increases. A significant additional lifetime improvement is achieved by increasing T as the wear increases. According to one aspect, implementation of very high T uses smaller codewords without much SNR penalty. The gain of adjustable T is greater when SNR varies from page to page.

A limitation of NAND flash memory used in solid state drives is the wear that results from program/erase cycles. This wear progressively degrades the ability to recover data, and ultimately limits the useful lifetime of the device. The amount of wear is amplified by internal "garbage collection" operations that are used to free up space for new data. This write amplification is mitigated by excess capacity, called overprovisioning, to make garbage collection more efficient. The life time of the solid state drive can be arranged to allow for more wear induced degradation by using more powerful error correction algorithms.

A presently disclosed strategy is to balance the overhead allocated to ECC and allocated to overprovisioning in order to reduce wear throughout the life of the device. Since the quality of the read signal degrades progressively with wear, the full ECC capability is only fully utilized at end of life. A strategy disclosed here is to scale the error correction capability over the life of the device to what is needed for the current level of wear. By limiting the error correction capability to only what is needed at any point in time, rather than what will be needed at end of life, the ECC overhead can be reduced thereby making more capacity available for overprovisioning. This method reduces the write amplification throughout the life of the device and as a result increased the endurance of the device. The life of the device can then be extended further by continuing to increase the error correction capability significantly beyond the level that is optimal when the correction capability is fixed. This is because the additional wear that results from the increased write amplification is in effect for a relatively short period near the end of life of the device.

According to one aspect, only as much error correction capability is used as is needed by any page or block at any point in the life of the device. Flash memory cells degrade progressively with program and erase cycles. This degradation can be characterized as a reduction in the SNR of each storage element or increase in the bit error rate. Since the bit error rate increases with program/erase cycles, it follows that the maximum number of program/erase cycles can be increased with a more powerful ECC.

ECC and overprovisioning improve endurance by helping recover degraded data or reducing wear. For a fixed total overhead, increased ECC capability comes at the expense of write amplification and vice versa. For a wide range of conditions considered, ECC capability with t greater than 100 (for a 4 KB page) can significantly improve endurance. The ECC gain diminishes as the rate of SNR degradation with P/E cycles increases. A significant additional endurance improvement can be achieved by increasing t as the wear increases. Practical implementations of very high t may use smaller code words without much SNR penalty. The gain of variable t is greater when SNR varies from page to page.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed.

What is claimed is:

1. An apparatus, comprising:
    a memory that is allocated to reported portions, and overprovisioned portions;
    an error correction circuit that generates error reports and that communicates with the memory in error correction coded data that has a controllable ECC length that is controlled by an ECC length input;
    an ECC length update circuit that receives the error reports and that provides an ECC length update to an ECC length table as a function of a history of error reports;
    an ECC length controller that accesses the ECC length table and that provides an ECC length to the ECC length input; and
    a memory allocation engine that accesses the ECC length table and that balances a size of the overprovisioned portions to maintain a size of the reported portions, the balancing being performed as a function of an average of ECC lengths in the ECC length table over a time interval in which a size of the memory decreases with accumulated erase cycles of the memory.

2. The apparatus of claim 1 wherein the ECC length update circuit calculates an ECC length update that indicates a minimal ECC length needed to correct errors for a selected address range of the memory based on error reports for the selected range of memory.

3. The apparatus of claim 1 wherein:
    the memory comprises memory blocks;
    the ECC length table comprises a current ECC length and the ECC length update for each of the memory blocks; and
    the current ECC length is updated by ECC length update as part of a block erase cycle.

4. The apparatus of claim 1 wherein:
    the memory comprises memory pages;
    the ECC length table comprises a current ECC length and the ECC length update for each of the memory pages; and
    the current ECC length is updated by ECC length update as part of a page erase cycle.

5. The apparatus of claim 1 wherein the memory comprises NAND flash memory.

6. The apparatus of claim 1 wherein the memory comprises NOR flash memory.

7. The apparatus of claim 1 wherein the memory comprises memory overhead that includes error correction overhead and overprovisioning overhead and the memory allocation engine balances the relative portions of error correction overhead and overprovisioning overhead to optimize a useful memory size.

8. The apparatus of claim 1 wherein, the memory comprises electrical memory.

9. An apparatus, comprising:
    a memory that is allocated to reported portions, and overprovisioned portions;
    an error correction circuit that generates error reports and that communicates with the memory in error correction coded data that has a controllable ECC length that is controlled by an ECC length input;
    an ECC length update circuit that receives the error reports and that provides an ECC length update to an ECC length table as a function of a history of error reports;
    an ECC length controller that accesses the ECC length table and that provides an ECC length to the ECC length input; and
    a memory allocation engine that accesses the ECC length table and that balances a size of the overprovisioned portions to maintain a size of the reported portions, the balancing being performed as a function of an average of ECC lengths in the ECC length table over a time interval in which signal to noise ratios of the memory increase with accumulated erase cycles of the memory.

10. The apparatus of claim 9 wherein the ECC length update circuit calculates an ECC length update that indicates a minimal ECC length needed to correct errors for a selected address range of the memory based on error reports for the selected range of memory.

11. The apparatus of claim 9 wherein:
    the memory comprises memory blocks;
    the ECC length table comprises a current ECC length and the ECC length update for each of the memory blocks; and
    the current ECC length is updated by ECC length update as part of a block erase cycle.

12. The apparatus of claim 9 wherein:
    the memory comprises memory pages;
    the ECC length table comprises a current ECC length and the ECC length update for each of the memory pages; and
    the current ECC length is updated by ECC length update as part of a page erase cycle.

13. The apparatus of claim 9 wherein the memory stores data in the form of a trapped electrical charge.

14. The apparatus of claim 9 wherein the memory stores data in the polarization of a ferroelectric element.

15. The apparatus of claim 9 wherein the memory comprises memory overhead that includes error correction overhead and overprovisioning overhead and the memory allocation engine balances the relative portions of error correction overhead and overprovisioning overhead to optimize a useful memory size.

16. A method, comprising:
    providing reported portions, and overprovisioned portions in a memory;
    communicating with the memory in error correction coded data that has a controllable ECC length;
    generating error reports including errors found in decoding the error correction coded data;
    provides an ECC length update to an ECC length table as a function of a history of error reports;

an ECC length controller that accesses the ECC length table and that providing an ECC length for the error correction coded data by accessing the ECC length table; and balancing a size of the overprovisioned portions to maintain a size of the reported portions, the balancing being performed as a function of an average of ECC lengths in the ECC length table over a time interval in which a size of the memory decreases with accumulated erase cycles of the memory.

17. The method of claim 16 wherein the memory comprises memory overhead that includes error correction overhead and overprovisioning overhead and:

balancing the relative portions of error correction overhead and overprovisioning overhead to optimize a useful memory size.

18. The method of claim 16 wherein the memory comprises memory blocks; the ECC length table comprises a current ECC length and the ECC length update for each of the memory blocks; and updating the current ECC length by an ECC length update as part of a block erase cycle.

19. The method of claim 16 wherein the memory comprises memory pages; the ECC length table comprises a current ECC length and the ECC length update for each of the memory pages; and updating current ECC length by an ECC length update as part of a page erase cycle.

* * * * *